United States Patent
Mori et al.

(10) Patent No.: US 7,148,148 B2
(45) Date of Patent: Dec. 12, 2006

(54) MASK FORMING AND REMOVING METHOD, AND SEMICONDUCTOR DEVICE, AN ELECTRIC CIRCUIT, A DISPLAY MODULE, A COLOR FILTER AND AN EMISSIVE DEVICE MANUFACTURED BY THE SAME METHOD

(75) Inventors: Yoshiaki Mori, Nagano ken (JP); Takuya Miyakawa, Suwa (JP); Mitsuru Sato, Suwa (JP); Shintaro Asuke, Suwa (JP); Kenichi Takagi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 435 days.

(21) Appl. No.: 10/309,198

(22) Filed: Dec. 4, 2002

(65) Prior Publication Data

US 2003/0143845 A1    Jul. 31, 2003

(30) Foreign Application Priority Data

Dec. 6, 2001  (JP) ............... 2001-373081

(51) Int. Cl.
  *H01L 21/302* (2006.01)
(52) U.S. Cl. ............... 438/704; 438/707; 438/715
(58) Field of Classification Search ........... 438/704, 438/707, 715
  See application file for complete search history.

(56) References Cited

U.S. PATENT DOCUMENTS 5,658,697 A * 8/1997 Lin ................ 430/7
5,863,233 A * 1/1999 Porter et al. ........... 445/50
6,120,674 A * 9/2000 Porter et al. ........... 205/640
6,613,486 B1 * 9/2003 Ohtsu et al. ............ 430/7
2002/0011421 A1 * 1/2002 Haba et al. ............. 205/667

FOREIGN PATENT DOCUMENTS

| EP | 1 113 502 A1 | 7/2001 |
|---|---|---|
| JP | A-9-186069 | 7/1997 |
| JP | A-2000-277520 | 10/2000 |
| JP | A-2000-282240 | 10/2000 |
| JP | A-2000-357685 | 12/2000 |
| JP | A-2001-284289 | 10/2001 |
| JP | A-2002-50610 | 2/2002 |
| WO | WO00/59040 | 10/2000 |

* cited by examiner

*Primary Examiner*—Nadine G. Norton
*Assistant Examiner*—Binh X. Tran
(74) *Attorney, Agent, or Firm*—Oliff & Berridge, PLC

(57) ABSTRACT

A mask forming method that can reduce manufacturing cost is disclosed. The method forms a mask on the surface of a member to be processed in order to form a desired pattern using liquid material for patterning. The method also includes applying resist to the entire surface of the member to be processed, drying the applied resist, patterning by removing the resist in a pattern-formation area using photolithography, and heating the resist.

23 Claims, 16 Drawing Sheets

(1)

(2)

(3)

(1)

(2)

(7)

(8) 
604

(9)

(10) 
605

(11)

(1)

(2)

(3)

MASK FORMING AND REMOVING METHOD, AND SEMICONDUCTOR DEVICE, AN ELECTRIC CIRCUIT, A DISPLAY MODULE, A COLOR FILTER AND AN EMISSIVE DEVICE MANUFACTURED BY THE SAME METHOD

BACKGROUND OF THE INVENTION

1. Field of Invention

The present invention relates to manufacturing fields of semiconductor devices, liquid crystal devices and other elemental devices including stacked thin film layers. The present invention also relates to fields of high-density packages and more to a mask forming method to form a pattern using liquid material for patterning in the vicinity of atmospheric pressure, without requiring a reduced-pressure environment when manufacturing devices. Moreover, the present invention relates to a semiconductor device manufactured by the mask forming method.

2. Description of Related Art

In the related art, a wiring pattern is formed over elements, after the elements are formed on the surface of a wafer substrate, in manufacturing a semiconductor device.

FIG. 15 and FIG. 16 show a process of related art patterning. When wiring is formed, for example, on the surface of a semiconductor wafer 1 shown in FIG. 15(a), a wiring layer 2 is formed by a plasma CVD method on the surface of the semiconductor wafer 1 where an insulating layer not shown in the figures, is formed, as shown in FIG. 15(b). The wiring layer 2 may be formed by sputtering.

After the wiring layer 2 is formed over the semiconductor wafer 1, as described above, the upper surface of the layer for wiring 2 is coated with photoresist so as to form a resist layer. Subsequently, the semiconductor wafer with the resist layer is exposed to light and photo-etched, such that a patterned resist layer 3 shown in FIG. 15(c) is formed.

Furthermore, the semiconductor wafer 1 is a dry etched, as shown in FIG. 16(a), and the wiring layer 2 is etched using the resist layer 3 as a mask, which is shown in FIG. 16(b). After the wiring layer 2 is left only under the resist layer 3, a solvent removes the resist layer 3 located over the wiring layer 2.

The above process allows a wiring pattern 4 to be formed on the surface of the semiconductor wafer 1.

However, the above manufacturing process and a semiconductor device manufactured by the process cause the following problems.

Specifically, since most of the related art process steps are performed in a vacuum (reduced-pressure environment), vacuum-processing equipment is essential for the above manufacturing process steps. The vacuum-processing equipment consumes a considerable amount of energy including energy for fundamental units to process surrounding exhaust air and cooling water, when performing the vacuum process. The consumed energy undesirably corresponds to 60% or more of the energy required for the entire manufacturing process.

The following constituent elements of a vacuum-processing equipment can be considered as factors for increases in consumed energy. Such constituent elements include a chamber load lock to transport a work from an atmospheric pressure environment to a vacuum condition, a plurality of dry pumps or turbopumps to evacuate a processing chamber, footprint enlarged in association with pluralized chambers to enhance throughput, the resulting expansion of clean room area, and increased fundamental facilities to maintain these constituent elements.

Although, in the related art, film formation has been performed by sputtering or CVD under reduced pressure, it is being advanced to develop a method to form a film using liquid material for patterning under atmospheric pressure in light of the above problems.

Further, in the related art process, a material layer for patterning, formed on the entire surface of a member to be processed, is etched so as to form a pattern. However, this etching undesirably consumes a considerable amount of energy.

SUMMARY OF THE INVENTION

In view of the above related art problems, the present invention provides a mask forming method, which forms a pattern using liquid material for patterning.

Moreover, the present invention provides a method of forming a mask capable of enhancing adhesiveness of a member to be processed. The present invention is also intended to provide a method of forming a mask capable of enhancing patterning performance of the mask, as well as pattern forming performance of a material for patterning.

Also, the present invention is intended to provide a method of removing a mask manufactured by the above mask forming method. Moreover, the present invention is intended to provide semiconductor devices, electric circuits, display modules, color filters, and emissive devices manufactured by the above mask forming method and the mask removing method.

In order to address the above goals, the mask forming method of the present invention, forms a mask on the surface of a member to be processed, in order to form a desired pattern using liquid material for patterning. The method also includes: forming a mask-material layer on the entire surface of the member to be processed; patterning by removing the mask-material layer in a pattern-formation area; forming the desired pattern by applying the liquid material for patterning; drying and baking the liquid material for patterning; and removing the mask.

Here, forming the mask-material layer, in case of a wet-type method, may employ an ink-jet method, an LSMCD method, a spin method, or spray, dip or direct coating (CAP Coat). Forming the mask-material layer, in case of a dry-type method, may employ a plasma CVD method, a plasma polymerization method (MOCVD, atmospheric pressure CVD, P-CVD, optical CVD, thermal CVD), a deposition method, a sputtering method, ion plating, or electron rays irradiation.

In the patterning, electric current is applied to a conductive material pattern formed on the surface of the member to be processed in electrolytic solution, such as carbonated water so as to electrolyze and remove the mask-material layer on the conductive material pattern. Consequently, it is possible to implement patterning along the conductive material pattern with simple process. Therefore, the manufacturing cost can be reduced.

Moreover, the mask forming method forms the mask for forming a predetermined pattern above the surface of the member to be processed and includes a heating step of heating the mask-material layer before or after the pattern forming step. The heating treatment improves mechanical strength of the mask and restrains interfusion of the mask material with the liquid material.

The heating may employ reduced-pressure drying in gas atmosphere activated by plasma, electron gun or photoexcitation method or in inert gas atmosphere, microwave heating, high-frequency heating, lamp-heating using a method of steps for rising temperature, or heating-medium heating using a method of steps for rising temperature.

Also, cleansing the surface of the member to be processed may be provided prior to the mask-material layer forming step. This prevents interfusion of impurities.

The cleansing, in case of a wet-type method, may employ cleansing using ultrapure water, oxidization cleansing using ozone water, detergent cleansing using surfactant, light-etching using hydrogen fluoride, or organic cleansing. The cleansing, in case of a dry-type method, may employ ultraviolet cleansing, oxidization cleansing using ozone gas, or light-etching using gas activated by plasma, electron gun or photoexcitation method.

Lyophobic surface treatment may be implemented prior to forming the mask-material layer, so as to render the entire surface of the member to be processed lyophilic to the mask material. Consequently, it is possible to enhance adhesiveness of the mask.

Lyophobic surface treatment may be implemented prior to forming the mask-material layer, so as to render the entire surface of the member to be processed lyophobic against the mask material. Consequently, it is possible to enhance stripping properties of the mask.

The lyophilic treatment may be implemented prior to forming the mask-material layer, so as to render the surface of the member to be processed in the pattern-formation area lyophilic to the mask material. Consequently, it is possible to enhance adhesiveness of the mask to the pattern-formation area, thereby improving the patterning performance.

The lyophobic surface treatment may be implemented prior to forming the mask material layer, so as to render the surface of the member to be processed excluding the pattern-formation area lyophobic against the mask material. Consequently, it is possible to enhance stripping properties of the mask, with respect to the member to be processed excluding the pattern formation area, thereby enhancing the patterning performance.

Further, before the process of forming the mask material, the lyophilic surface treatment may be implemented prior to forming the mask-material layer, so as to render the surface of the member to be processed in the pattern-formation area lyophilic to the mask material, while the lyophobic surface treatment may be provided so as to render the surface of the member to be processed excluding the pattern-formation area lyophobic against the mask material. Consequently, it is possible to enhance adhesiveness of the mask with respect to the member to be processed in the pattern-formation area and also to enhance stripping properties of the mask with respect to the member to be processed excluding the pattern-formation area. Then, the patterning performance can be enhanced.

Further, before the process of patterning, a lyophilic surface treatment may be implemented so as to render the surface of the mask material layer in the pattern-formation area lyophilic to a mask removing material.

Consequently, the pattern-formation area readily conforms to the mask removing material, thereby shortening the patterning process time. Therefore, the manufacturing cost can be reduced.

Further, before the process of patterning, the lyophobic surface treatment may be implemented so as to render the surface of the mask material layer, excluding the pattern-formation area, lyophobic against the mask removing material. Consequently, the area excluding the pattern formation area repels the mask removing material, thereby enhancing the patterning performance.

Further, surface lyophilic treatment may be implemented prior to patterning, so as to render the surface of the mask-material layer in the pattern-formation area lyophilic to the mask removing material. Also, the lyophobic surface treatment may be implemented so as to render the surface of the mask-material layer, excluding the pattern-formation area, lyophobic against the mask removing material. Consequently, it is possible to shorten the patterning process time, thereby enhancing the patterning performance.

Further, the lyophobic surface treatment may be implemented prior to patterning, so as to render the entire surface of the mask material layer lyophobic against the material for patterning. Also, the patterning removes the mask material in the pattern-formation area, which has been subjected to the lyophobic surface treatment. Therefore, it is possible to enhance the pattern forming performance by liquid material for patterning.

Further, the lyophilic surface treatment may be implemented prior to heating, so as to render the surface of the member to be processed, in the pattern-formation area, lyophilic to the material for patterning. Consequently, it is possible to shorten the time of forming the pattern using the material for patterning, thereby reducing the manufacturing cost.

Further, the lyophobic surface treatment may be implemented prior to heating, so as to render the surface of the mask-material layer, excluding the pattern formation area, lyophobic against the material for patterning. Consequently, it is possible to enhance the pattern forming performance by the liquid material for patterning.

Further, before heating, the lyophilic surface treatment may be implemented, so as to render the surface of the member to be processed in the pattern-formation area, lyophilic to the material for patterning, while the lyophobic surface treatment may be implemented so as to render the surface of the mask-material layer, excluding the pattern-formation area, lyophobic against the material for patterning. Consequently, it is possible to shorten the time of forming the pattern using the material for patterning, thereby enhancing the pattern forming performance by the liquid material for patterning.

Further, the lyophilic surface treatment may be implemented after heating, so as to render the surface of the member to be processed, in the pattern-formation area, lyophilic to the material for patterning.

Consequently, it is possible to shorten the time of forming the pattern using the material for patterning, thereby reducing the manufacturing cost.

Further, the lyophobic surface treatment may be implemented after heating, so as to render the surface of the mask-material layer, excluding the pattern-formation area, lyophobic against the material for patterning. Consequently, it is possible to enhance the patterning performance by the liquid material for patterning.

Further, the lyophilic surface treatment may be implemented after heating, so as to render the surface of the member to be processed in the pattern-formation area, lyophilic to the material for patterning. Also, the lyophobic surface treatment may be implemented so as to render the surface of the mask-material layer, excluding the pattern-formation area, lyophobic against the material for patterning. Consequently, it is possible to shorten the time of forming the pattern using the material for patterning and to enhance the pattern forming performance by the liquid material for patterning.

Here, the lyophilic surface treatment, in case of a wet-type method, may employ water-deionizing treatment, oxidization treatment using ozone water, treatment using acid such as hydrogen fluoride, treatment using alkali, dip treatment using surfactant such as anion, nonion, or cation, treatment using silane, alminate or titanate coupling agent, SAM film formation, or treatment using organic solvent. Also, the lyophilic surface treatment, in case of a dry-type method, may employ ultraviolet treatment, oxidization treatment using ozone gas generated by plasma, an electron gun, or photoexcitation method, electron rays irradiation, deposition of silane coupling agent, or plasma polymerization such as polyethylene.

Further, the lyophobic surface treatment, in case of a wet-type method, may employ dip treatment using surfactant such as anion, nonion, or cation, treatment using silane, alminate or titanate coupling agent, or SAM film formation. The lyophobic surface treatment, in case of a dry-type method, may employ fluoride treatment using plasma, an electron gun, or photoexcitation method, plasma polymerization of fluoroplastic film or silicone film, oxidization treatment using ozone gas generated by plasma, an electron gun or photoexcitation method, or deposition of silane coupling agent.

Here, the mask material may be obtained by applying the fluoride treatment to the surface of an organic matter, such as fluoroplastic polymerized film, fluorine compound, and resist. Also, the electromagnetic waves may be replaced by ultraviolet rays. Consequently, the mask material itself has the lyophobic property and also can be easily treated to have the lyophilic property.

Further, the member to be processed may be maintained in an inert gas atmosphere in each of the above steps. The member to be processed may be maintained in an inert gas atmosphere when transported between the respective steps. Consequently, it is possible to prevent oxidization and corrosion of the mask material.

Further, the member to be processed may be maintained in an active gas atmosphere in each of the above steps. The member to be processed may be maintained in an active gas atmosphere when transported between the respective steps. Consequently, it is possible to prevent oxidization and reduction of the mask material.

The mask removing method of the present invention may include removing the mask after applying the liquid material for patterning, so as to form the predetermined pattern using the mask manufactured, by any one of the above mask manufacturing methods.

Here, the mask removing, a using wet-type method, may employ oxidization treatment using ozone water, organic cleansing using acetone or resist peeling agent, or supercritical treatment using carbon dioxide. The mask removing, using a dry-type method, may employ ultraviolet rays irradiation, or ashing using gas activated by plasma, an electron gun or photoexcitation method.

Further, removing the remainder of the material for patterning on the surface of the mask may be performed prior to the mask removing step. Consequently, it is possible to shorten the process time of the mask removing step, thereby reducing the manufacturing cost.

Here, the remainder removing, using a wet-type method, may employ spin etch or CMP. Also, the remainder removing, using a dry-type method, may employ etch back using gas activated by plasma, electron gun or photoexcitation method.

Molding the surface of the pattern may be performed prior to mask removal. Consequently, it is possible to mold the pattern into a predetermined shape without damaging it.

Molding, using a wet-type method, may be performed by removing a coating film on the upper face of the mask using spin etch or CMP. Molding, using a dry-type method, may employ etch back using gas activated by plasma, electron gun, or by photoexcitation method.

Cleansing the member to be processed may be performed prior to mask removal. Consequently, it is possible to prevent interfusion of impurities.

Here, cleansing using a wet-type method, may employ cleansing using purified water, oxidization cleansing using ozone water, acid-alkali cleansing (RCA cleansing), organic cleansing (IPA), light etching using hydrogen fluoride, or supercritical treatment using carbon dioxide. Cleansing using a dry-type method, may employ ultraviolet cleansing, oxidization cleansing using ozone gas, or ashing using gas activated by plasma, electron gun or photoexcitation method.

Further, the lyophilic surface treatment may be implemented prior to mask removal so as to impart a lyophilic property to the mask removing material. Consequently, it is possible to provide conformity to the mask removing material and to shorten the time of removing the mask. Therefore, the manufacturing cost can be reduced.

The lyophilic surface treatment using a wet-type method, may employ water-deionizing treatment, oxidization using ozone water, or acid-alkali cleansing (RCA cleansing). The lyophilic surface treatment using a dry-type method may employ ultraviolet treatment, oxidization treatment using ozone gas generated by plasma, electron gun, or photoexcitation method, deposition of silane coupling agent, or plasma polymerization.

Preliminary heating on the mask may be provided prior to mask removal. Also, it is preferable that preliminary heating on the mask be performed prior to mask removal. Consequently, it is possible to shorten the time of removing the mask, thereby reducing the manufacturing cost.

The preliminary heating can be performed by lamp heating or resistance heating.

Moreover, the mask removal may be performed by heating the mask-material layer through the member to be processed, while simultaneously irradiating the member with electromagnetic waves. Alternatively, the mask removal may be performed by heating the mask-material layer through the member to be processed, after irradiating the member with electromagnetic waves. The mask-material layer may also be directly heated, not through the member to be processed. Consequently, it is possible to shorten the patterning time.

Further, molding the surface of the pattern may be provided after mask removal. Consequently, it is possible to enhance precision in processing the pattern.

Here, damage on the pattern may be repaired after mask removal. Consequently, it is possible to enhance the physical properties of the pattern.

Here, the repairing may employ microwave heating, high-frequency heating, lamp heating, or heating-medium heating.

Further, the lyophilic surface treatment may be implemented after mask removal so as to impart the lyophilic property to a material of a film to be formed next to the pattern. Consequently, it is possible to enhance adhesiveness to the next film.

Here, the surface treatment using a wet-type method, may employ water-deionizing treatment, oxidization treatment using ozone water, acid-alkali treatment, dip treatment using surfactant such as anion, nonion, or cation, treatment using silane, alminate or titanate coupling agent, SAM film formation, or treatment using organic solvent. Also, the surface treatment using a dry-type method, may employ ultraviolet treatment, oxidization treatment using ozone gas generated by plasma, an electron gun, or photoexcitation method, electron rays irradiation, deposition of silane coupling agent, or plasma polymerization such as polyethylene.

Further, the member to be processed may be maintained in an inert gas atmosphere in each of the above steps. Also, the member to be processed may be maintained in an inert gas atmosphere when transported between the respective steps. Consequently, it is possible to prevent oxidization and corrosion of the mask material.

Further, the member to be processed may be maintained in an active gas atmosphere in each of the above steps. Also, the member to be processed may be maintained in an active gas atmosphere when transported between the respective steps. Consequently, it is possible to prevent oxidization and reduction of the mask material.

Further, prior to forming the mask-material layer, the lyophilic surface treatment may be implemented, so as to render the surface of the member to be processed in the pattern-formation area, lyophilic to the mask material, while the lyophobic surface treatment may be implemented, so as to render the surface of the member to be processed, excluding the pattern-formation area, lyophobic against the mask material. Consequently, it is possible to improve adhesiveness of the mask to the pattern-formation area of the member to be processed as well as the stripping property of the mask with respect to the member to be processed excluding the pattern-formation area. Therefore, the patterning performance can be enhanced.

Further, the lyophilic surface treatment may be implemented prior to patterning, so as to render the surface of the mask-material layer in the pattern-formation area lyophilic to the mask removing material. Consequently, the mask-material layer in the pattern-formation area readily conforms to the mask removing material, thereby shortening the patterning process time. Therefore, the manufacturing cost can be reduced.

Further, the lyophobic surface treatment may be implemented prior to patterning, so as to render the surface of the mask-material layer, excluding the pattern-formation area, lyophobic against the mask removing material. Consequently, the mask-material layer excluding the pattern-formation area repels the mask removing material, thereby enhancing the patterning performance.

Further, prior to patterning, the lyophilic surface treatment may be implemented, so as to render the surface of the mask-material layer in the pattern-formation area, lyophilic to the mask removing material, while the lyophobic surface treatment may be implemented so as to render the surface of the mask-material layer, excluding the pattern-formation area, lyophobic to the mask removing material. Consequently, it is possible to shorten the patterning process time, thereby enhancing the patterning performance.

Also, the above lyophilic surface treatment and/or the lyophobic surface treatment may be performed prior to patterning of the wet-type method.

Here, a direct draw may be performed by introducing source gas of the mask material to the surface of the member to be processed and also irradiating electromagnetic waves to the surface of the member to be processed, in the pattern-formation area, in order to prevent formation of the mask-material layer in the pattern-formation area. Consequently, it is possible to reduce the number of steps and reduce the manufacturing cost.

Further, the lyophobic surface treatment may be performed by forming a fluoroplastic polymerized film. The lyophobic surface treatment may be performed by conducting fluoride treatment on the surface. Moreover, the lyophilic surface treatment may be performed by irradiating electromagnetic waves. The electromagnetic waves may be replaced by ultraviolet rays. Consequently, it is possible to easily perform the lyophobic surface treatment and the lyophilic surface treatment. Therefore, the manufacturing cost can be reduced.

Further, the lyophilic surface treatment may be performed after patterning by exposing the member to be processed to gas including fluorine and irradiating the member to be processed with electromagnetic waves so as to render the surface of the member to be processed, in the pattern-formation area, lyophilic to the material for patterning. Simultaneously, the lyophobic surface treatment may be performed so as to render the surface of the member to be processed, excluding the pattern-formation area, lyophobic against the material for patterning. Consequently, it is possible to reduce the number of steps and thus reduce the manufacturing cost.

A semiconductor device of the present invention is manufactured by any one of the above mask forming methods and/or by any one of the above mask removing methods. Consequently, it is possible to manufacture the semiconductor device with the above-mentioned effects.

Further, an electric circuit of the present invention is manufactured by any one of the mask forming methods and/or by any one of the mask removing methods. Consequently, it is possible to manufacture the electric circuit with the above-mentioned effects.

Further, a display module of the present invention is manufactured by any one of the above mask forming methods and/or by any one of the mask removing methods. Consequently, it is possible to manufacture the display module with the above-mentioned effects.

Further, an emissive device of the present invention is manufactured by any one of the above mask forming methods and/or by any one of the mask removing methods. Consequently, it is possible to manufacture the emissive device with the above-mentioned effects.

DETAILED DESCRIPTION OF PREFERRED EMBODIMENTS

With reference to the accompanying drawings, preferred exemplary embodiments will be explained in detail as to a mask forming method, a mask removing method, a semiconductor device, an electric circuit, a display module and an emissive device according to the present invention. The following exemplary embodiments only serve as one of the aspects of the present invention, and the present invention is not therefore limited to the following exemplary embodiments.

EXAMPLE 1

First Exemplary Embodiment

First, a mask forming method is explained as a first exemplary embodiment. The mask forming method according to the first exemplary embodiment performs patterning by conducting electric current to a metal pattern 304 in electrolytic solution and then electrolyzing a mask-material layer on the metal pattern 304 to remove it. The patterning forms a new pattern 310, shown in FIG. 2(b) on the metal pattern 304, which is formed on the surface of a member to be processed 10 shown in FIG. 1(a). The method includes first, forming the mask-material layer over the entire surface of the member to be processed, second, heating the mask-material layer, third, patterning by removing the mask-material layer that remains in a pattern-formation area in the electrolytic solution and fourth, heating the mask-material layer. Here, the member to be processed in the first exemplary embodiment may be a silicon wafer.

Figure 1:
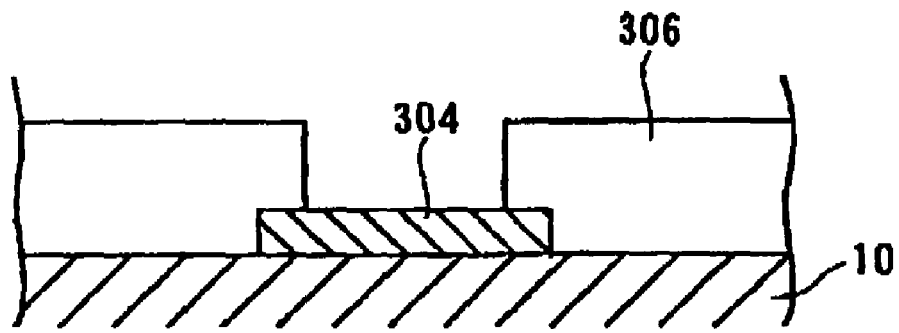
FIGS. 1(a)–1(c) are first explanatory schematics illustrating a mask forming method according to a first exemplary embodiment.
Figure 1:
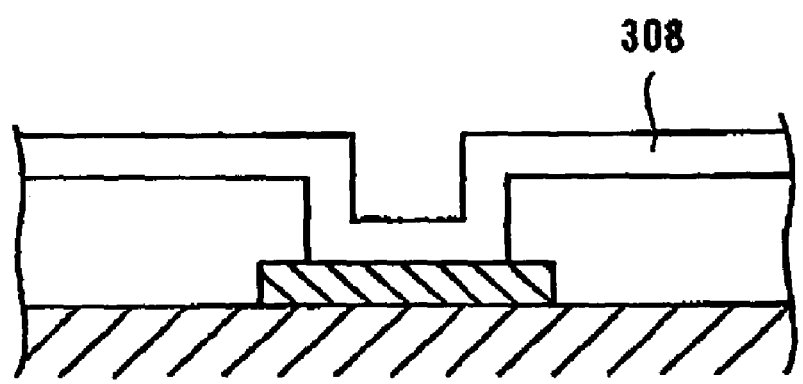
Figure 1:
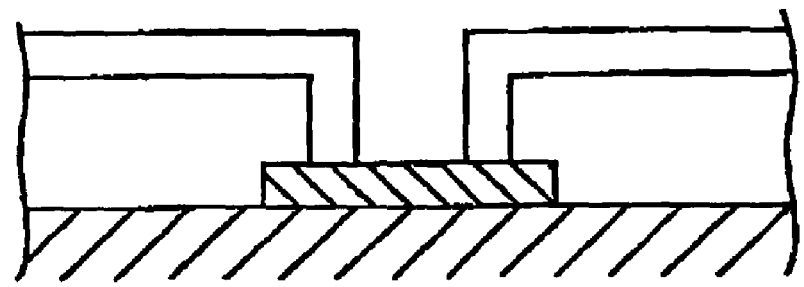
Figure 3:
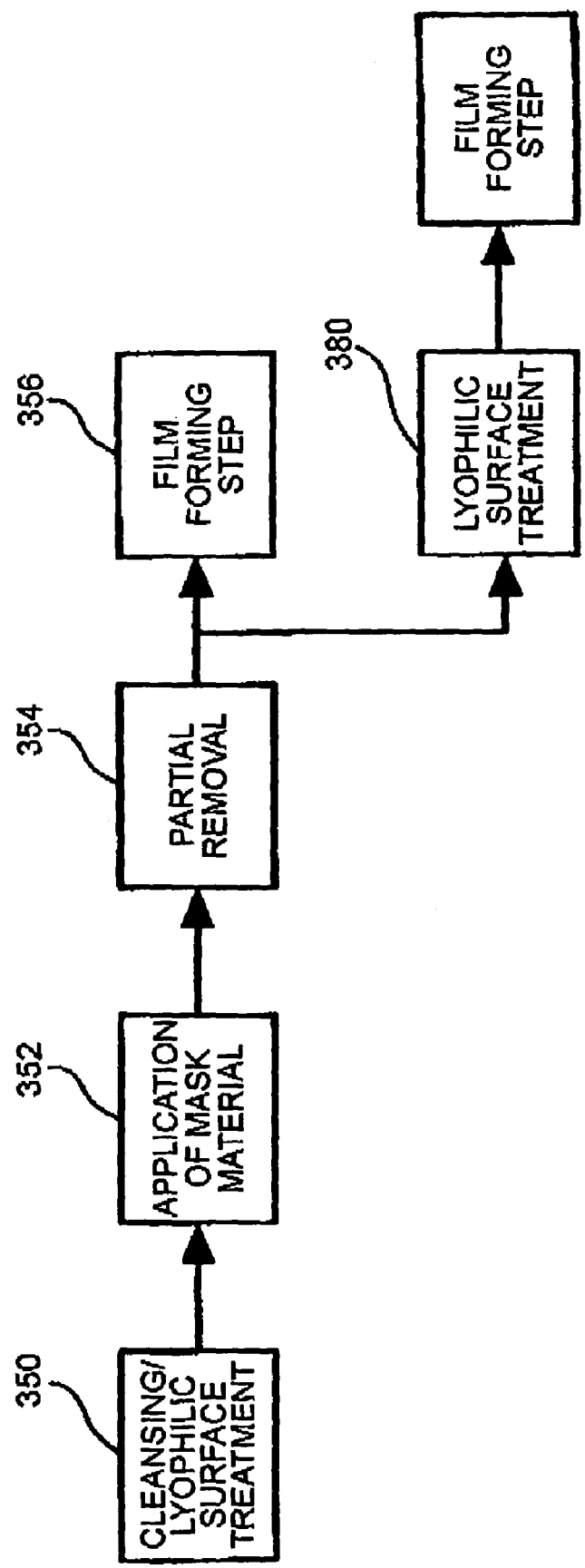
FIG. 3 is a flowchart of the mask forming method according to the first exemplary embodiment.

The mask forming method is first explained by taking the member to be processed 10, as an example. Here, the member to be processed 10 is provided with the metal pattern 304, such as wiring, on the surface thereof and with an insulating layer 306 on the surface thereof, excluding a metal pattern formation area, as shown in FIG. 1(a). FIG. 3 shows a flowchart illustrating this example.

First, the member to be processed is cleansed, and the surface thereof is treated to have the property lyophilic to liquid (S350). A cleansing unit for the member to be processed repeats cleansing, using ultrapure water or chemicals, with functions such as maceration, oscillation, supersonic vibration and spray in case of a wet-type method. It is also possible to use a cleansing unit that introduces hydrogen fluoride into a chamber, where the member to be processed is placed, so as to etch an oxide film on the surface of the member to be processed. In case of a dry-type method, ultraviolet rays are irradiated onto the member to be processed in the atmosphere including oxygen and react with an organic matter attached to the surface to remove this organic matter.

Next, a fluoroplastic polymerized film 308 is formed over the surface of the member to be processed as a mask material, as shown in FIG. 1(b) (S352). Besides the fluoroplastic polymerized film, it is also possible to use a lyophobic material such as a silicone polymerized film as a mask. However, it is preferable to use a material that exhibits volatility to electromagnetic waves. Liquid organic matter, including straight-chain PFC such as $C_4F_{10}$ and $C_8F_{18}$, is used as an ingredient of the fluoroplastic polymerized film. When the straight-chain PFC gas is made to be in a plasma-state, the straight-chain PFC becomes active. The straight-chain PFC then reaches the surface of the member to be processed and polymerizes with the surface, such that the fluoroplastic polymerized film is formed over the surface of the member to be processed.

Figure 4:
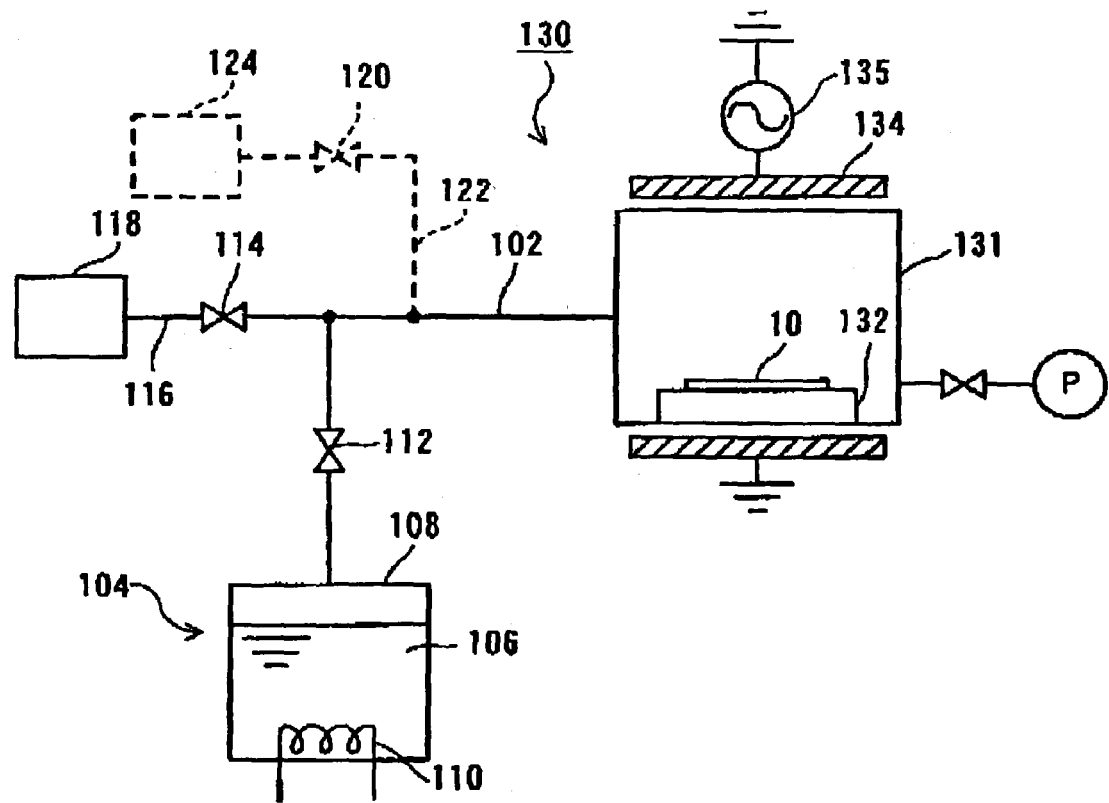
FIG. 4 is an explanatory schematic illustrating a polymerized film forming device.

Forming the fluoroplastic polymerized film uses a polymerized film forming device as below. FIG. 4 shows a schematic of the polymerized film forming device. A lyophobic surface treatment device 130 includes a processing chamber 131 so as to place the member to be processed 10, such as silicone wafer, on a processing stage 132 in the processing chamber 131. Moreover, the device includes high-frequency electrodes 134 over and under the processing chamber 131, and they are connected to a high-frequency power source 135.

Moreover, a processed gas supply unit 104 is connected to the processing chamber 131 through a supplying pipe 102 provided with a flow volume control valve 112. The processed gas supply unit 104 includes a container 108 that stores liquid organic matter 106 including straight-chain PFC such as $C_4F_{10}$ and $C_8F_{18}$. The container 108 is provided with a heating medium 110 as a heating head in order to heat and vaporize the liquid organic matter 106. Also, a carrier gas supply unit 118 is connected to the processing chamber 131 through a carrier pipe 116 provided with a flow volume control valve 114, on the lower course side of the flow volume control valve 112, provided for the supplying pipe 102. Inert gas such as nitrogen and argon is used as carrier gas.

A second processed gas supply unit 124 may be connected to the supplying pipe 102 through a pipe 122 provided with a flow volume control valve 120, as shown by the dotted line of FIG. 4. In that case, $CF_4$ is supplied and added to vapor of the liquid organic matter 106 as the second processed gas from the second processed gas supply unit 124. The mixed gas of the organic matter vapor and $CF_4$ is made to be plasma-state in the processing chamber 131. Then, activated fluorine reacts with vapor of the liquid organic matter 106 and gets incorporated into a fluorine-eliminated portion of a film polymerized over the surface of the member to be processed 10, thereby improving lyophobic property of the polymerized film.

Next, the fluoroplastic polymerized film is patterned by electrolysis (S354).

Figure 5:
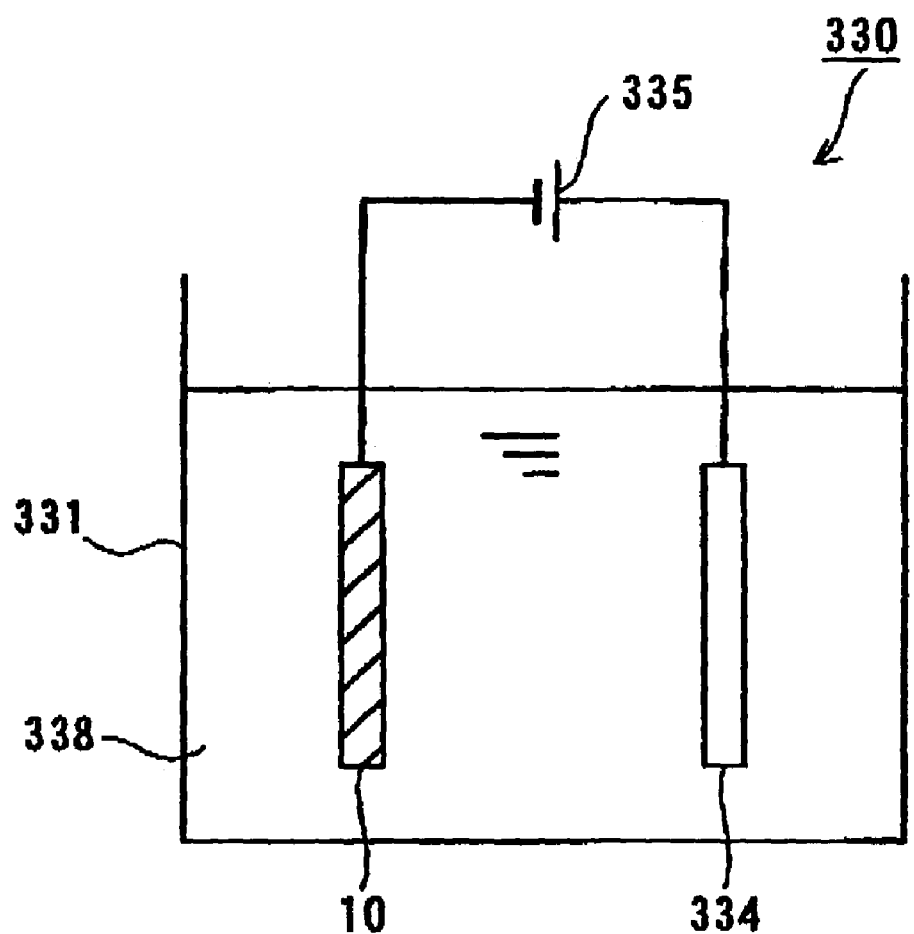
FIG. 5 is an explanatory schematic illustrating an electrolyzing device.

FIG. 5 shows a schematic of an electrolyzing device. An electrolyzing device 330 includes a container 331 filled with electrolytic solution 338. The electrolytic solution is satisfactory as long as it is ion-resolved, and carbonated water or plating liquid may be used. An electrode 334 is provided in the electrolytic solution 338, and the member to be processed 10 can also be immersed therein. Also, a power source 335 is provided so as to apply voltage between the metal pattern 304 of the immersed member to be processed 10 and the electrode 334. Specifically, the member to be processed 10 is first immersed in the electrolytic solution 338 of the electrolyzing device 330 shown in FIG. 5. Next, voltage is applied between the metal pattern 304 on the surface of the member to be processed 10 and the electrode 334. Consequently, the polymerized film 308 on the metal pattern 304 is electrolyzed and then removed. The polymerized film 308 is thereby patterned along the metal pattern 304, as shown in FIG. 1(c).

Also, the lyophilic surface treatment may be implemented prior to the electrolysis, so as to render the fluoroplastic polymerized film in the pattern-formation area lyophilic to the electrolytic solution. More specifically, part of the polymerized film is decomposed and removed by irradiating ultraviolet rays onto the polymerized film 308 in the pattern-formation area. Consequently, the electrolytic solution readily conforms to the polymerized film. The patterning is thus promoted, thereby shortening the process time.

Moreover, the lyophilic surface treatment by ultraviolet irradiation may be added so as to give the lyophilic property to the pattern-formation area after the electrolysis (S380). This improves adhesiveness between the surface of the member to be processed and the material for patterning.

Also, the fluoroplastic polymerized film may be heated. The heating treatment is performed with a baking furnace. The kind of the baking furnace differs according to the heating method to be employed. The baking furnace employing a convective method flows air or nitrogen gas heated by a heating medium into the inside thereof and then heats the surface of the mask-material layer. An irradiation method irradiates infrared light or micro waves from above the mask-material layer, such that the mask-material layer absorbs it to be heated. A conduction method utilizes heat conduction from a heating element below the member to be processed, in order to apply heat and readily keeps the temperature of the member constant. Moreover, it is possible to release low molecular weight organic matter contained inside the furnace in a short period of time by employing a structure of decreasing pressure inside the furnace. Consequently, the low molecular weight organic matter contained in the polymerized film can be vaporized and removed, thereby preventing the low molecular weight organic matter from getting mixed in the material for patterning in a film forming process, as will be described later.

Also, the lyophilic surface treatment may be implemented prior to the electrolysis in order to render the fluoroplastic polymerized film in the pattern-formation area lyophilic to the electrolytic solution. Concretely, part of the polymerized film is decomposed and removed by irradiating ultraviolet rays onto the polymerized film 308 in the pattern-formation area. Consequently, the electrolytic solution readily conforms to the polymerized film. The patterning is thus promoted, thereby shortening the process time.

The mask for the material for patterning is formed in the above manner.

Figure 2:
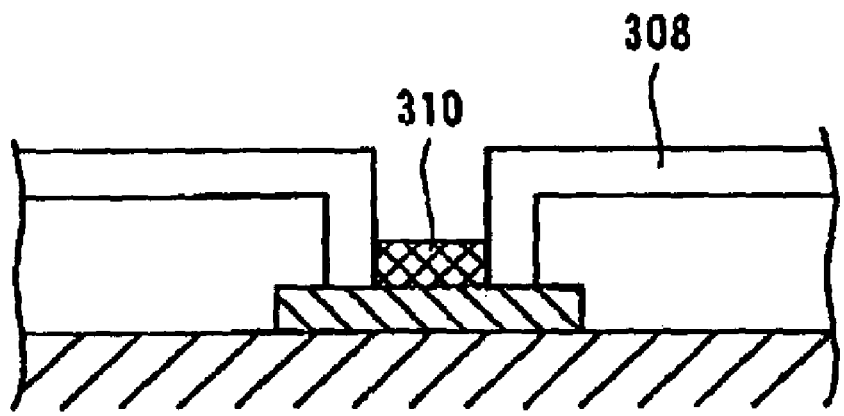
FIGS. 2(a)–2(b) are second explanatory schematics illustrating the mask forming method according to the first exemplary embodiment.
Figure 2:
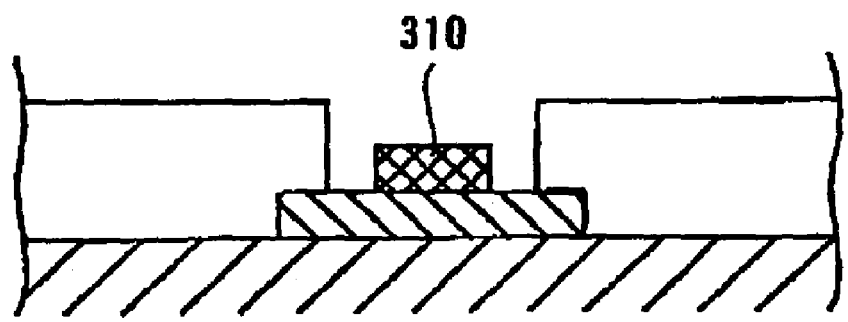

Subsequently, solution of material for patterning is supplied over the surface of the member to be processed, so as to form a film, as shown in FIG. 2(a) (S356). Also, since the fluoroplastic polymerized film is lyophobic against the material for patterning, the material for patterning does not accumulate on the mask material. Next, the solution of material for patterning is dried and subsequently heated. The fluoroplastic polymerized film 308 as the mask material is then removed so as to realize the complete state shown in FIG. 2 (b).

Second Exemplary Embodiment

Next, mask removing step according to the second exemplary embodiment is implemented by irradiating the polymerized film with ultraviolet rays. The member to be processed 10 is placed in a processing chamber 432 of a surface-reforming device 430 shown in FIG. 6, and an ultraviolet lamp 440 is placed above the processing chamber 432. The ultraviolet lamp 440 is placed inside an ultraviolet lamp chamber 442, where nitrogen gas can be replaceable, because it would be burned when lighted in the atmospheric air. The wall surface of the ultraviolet lamp chamber 442 on the side of the processing chamber 432 is formed of a glass plate 441 that transmits ultraviolet rays, such that the member to be processed 10 can be irradiated with ultraviolet rays. On the other hand, the wall surface of the processing chamber 432 on the side of the ultraviolet lamp chamber 442 is formed of a fluorite 431 that transmits ultraviolet rays. This configuration allows the member to be processed to be irradiated with ultraviolet rays and also prevents the glass plate 441 from getting eroded by excited active species of fluorine, which is supplied to the processing chamber 432. Next, inert gas such as $N_2$ gas is introduced into the processing chamber 432 from a processed gas supply route 435, and the surface of the member to be processed 10 is irradiated with ultraviolet rays, thereby cutting bond of the fluoroplastic polymerized film and removing the film.

Figure 7:
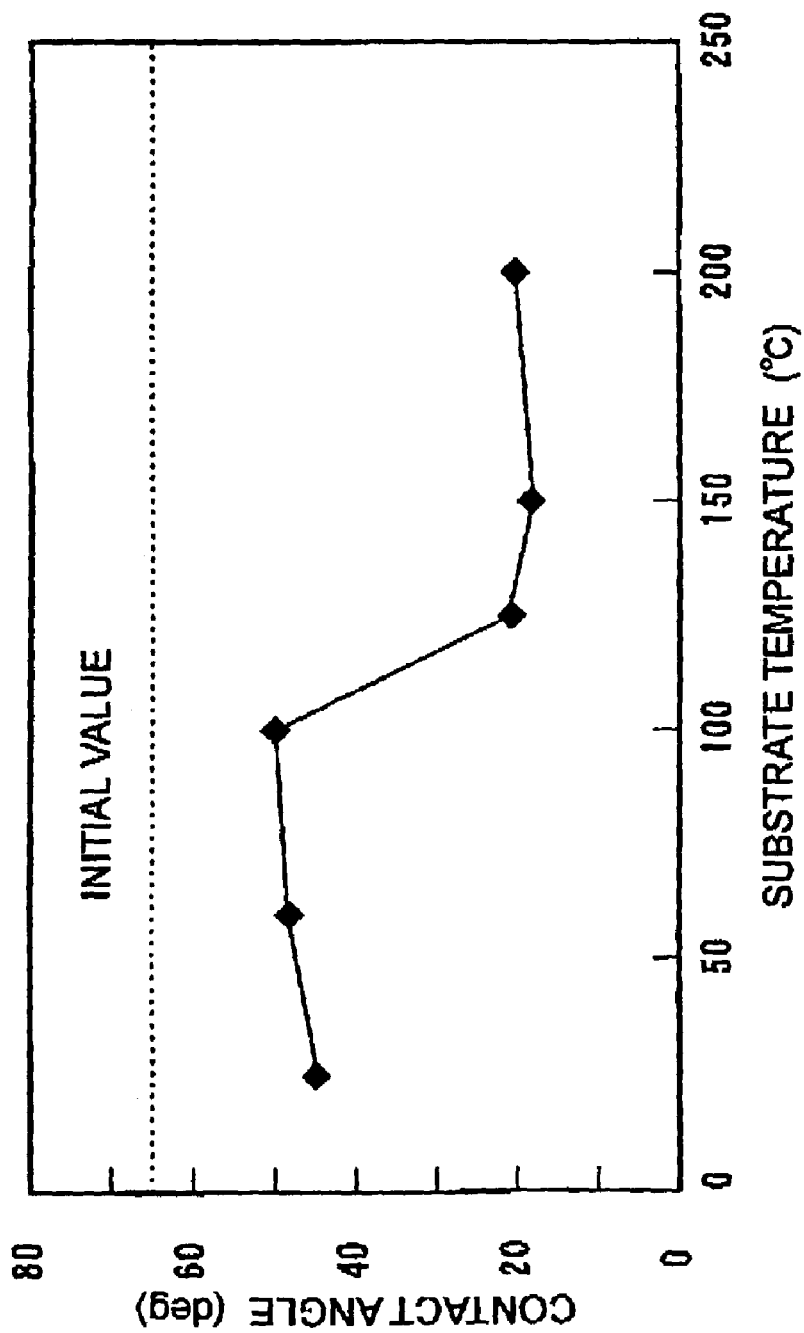
FIG. 7 is a graph illustrating changes of contact angles at the surface of a substrate to be processed, when the substrate provided with a fluoroplastic polymerized film is irradiated with ultraviolet rays and simultaneously heated in varying temperatures.

When employing a mask material which can further be decomposed by heat, such as the fluoroplastic polymerized film, applying heat can shorten the patterning time. For example, FIG. 7 shows contact angles at the surface of a substrate to be processed, provided with the fluoroplastic polymerized film, when the substrate is heated in various degrees of temperature while simultaneously being irradiated with ultraviolet rays. Also, the wavelength of irradiated ultraviolet rays is 172 nm, and patterning time is set equal for each substrate temperature in FIG. 7. Also, a lower contact angle at the substrate surface after patterning indicates a greater degree of decomposition and removal of the lyophobic fluoroplastic polymerized film. As shown in FIG. 7, the contact angle is remarkably lowered when the substrate temperature is set to 120° C. or more, in comparison with the case that the substrate temperature is set to 25° C. of the room temperature. Therefore, the patterning time can be shortened.

Figure 8:
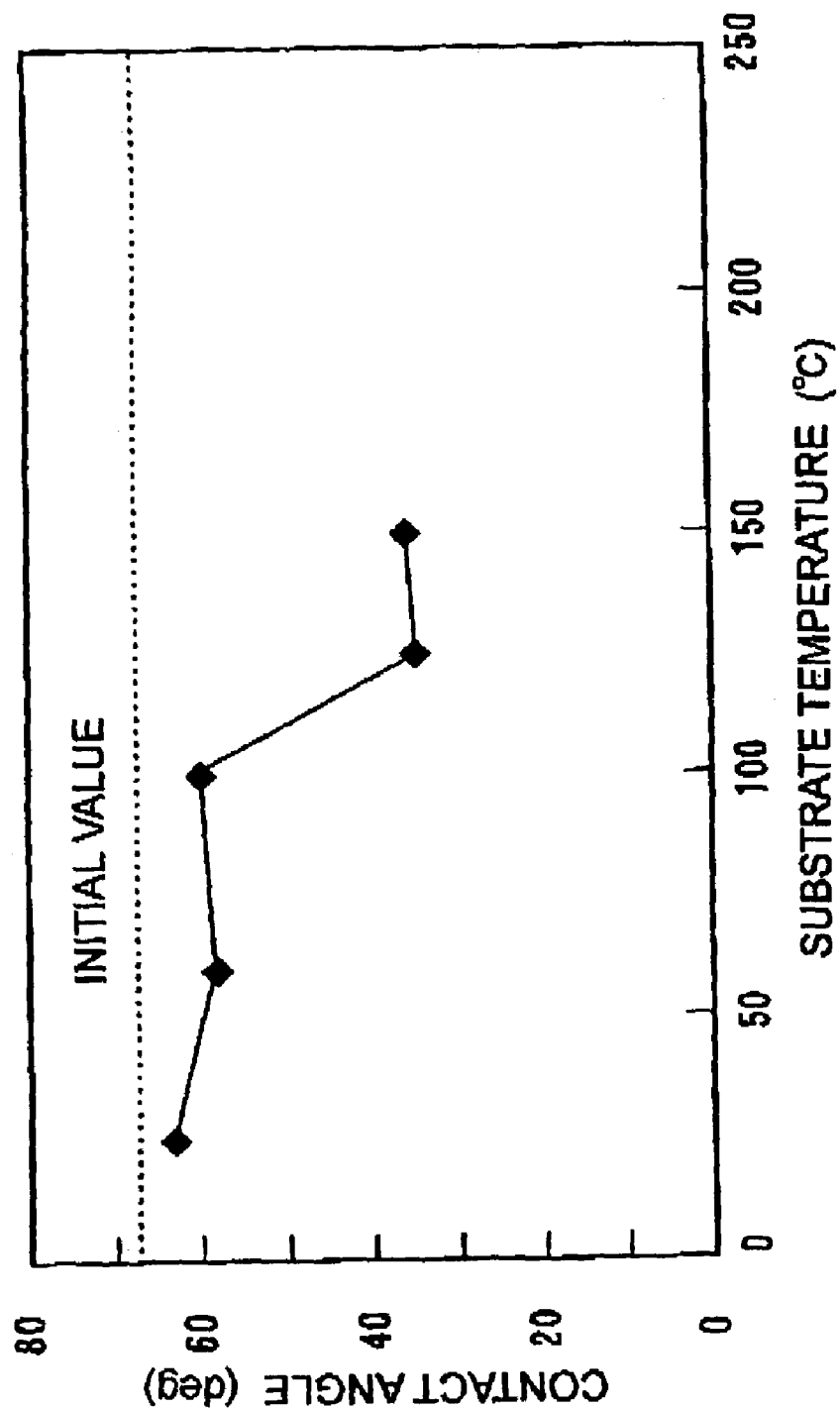
FIG. 8 is a graph illustrating changes of contact angles at the surface of a substrate to be processed, when the substrate provided with a fluoroplastic polymerized film is heated in varying temperatures after irradiated with ultraviolet rays.

It is also possible to shorten the process time by implementing heat treatment after the mask material is irradiated with ultraviolet rays. For example, FIG. 8 shows contact angles at the surface of the substrate to be processed, provided with the fluoroplastic polymerized film, when the substrate is heated in various degrees of temperature after being irradiated with ultraviolet rays in room temperature. Here, the wavelength of irradiated ultraviolet rays is 172 nm, and the time for irradiating ultraviolet rays and that for heating are equal, respectively, for each substrate temperature in FIG. 8.

As shown in FIG. 8, the contact angle is remarkably lowered when the substrate temperature is set to 120° C. or more, in comparison with the case that the substrate temperature is set to 25° C. of the room temperature. Therefore, the patterning time can be shortened.

Moreover, the polymerized film may be burned and removed away by being exposed to activated ozone gas or oxygen gas. In that case, the fluoroplastic polymerized film is decomposed and removed by carbon dioxide gas and fluorine gas.

Also, it is preferable that only a mask-material layer with a small heat capacity be heated in the above heat treatment from the viewpoint of energy saving.

Moreover, section molding, which smoothes the surface of a formed pattern, may be implemented, keeping the pattern to a predetermined height, before or after the removal of the polymerized film. Precision of the pattern process is thereby improved. The molding step can be implemented by etch back or Chemical Mechanical Polishing (CMP). Also, it is preferable to repair the pattern when it is damaged due to molding. The properties of the pattern are thereby improved.

When forming a protective film as a film next to the formed pattern, it is also preferable to implement the lyophilic surface treatment to impart the lyophilic property to this next film after the removal of the polymerized film. Consequently, it is possible to improve adhesiveness to the next film.

In each of the above steps, the member to be processed may be maintained in an inert gas atmosphere. Also, the member to be processed may be maintained in an inert gas atmosphere when being transported between the respective steps. This prevents oxidization and corrosion of the mask material.

Types of devices to transport the member to be processed from a unit to another includes a sheet-feeding type to transport a wafer one by one and a batch type to transport plural units of the members to be processed being accommodated in a cassette. Air-transport and belt-transport can be given as examples of the sheet-feeding type. The air transport blows air diagonally upwards from the backside of the member to be processed in order to float the member while giving the member thrust in a certain direction. On the other hand, the batch type transports cassettes storing the members to be processed using an automated guided vehicle (AGV) or a robot. In each of the above steps, the member to be processed may be maintained in an active gas atmosphere. Also, the member to be processed may be maintained in an active gas atmosphere when transported between the above respective steps. This prevents oxidization and reduction of the mask material.

In the above described mask forming method of the first exemplary embodiment, patterning is implemented by conducting electric current to the metal pattern formed on the surface of the member to be processed in electrolytic solution and then electrolyzing the mask-material layer on the metal pattern to remove it. Consequently, it is possible to easily perform patterning along the metal pattern. Therefore, the manufacturing cost can be reduced.

A structure, in which a functional thin film is formed on a substrate by the pattern forming method of the present invention, may be applied to, for example, semiconductor devices, electric circuits, display modules and emissive devices.

EXAMPLE 2

Figure 9:
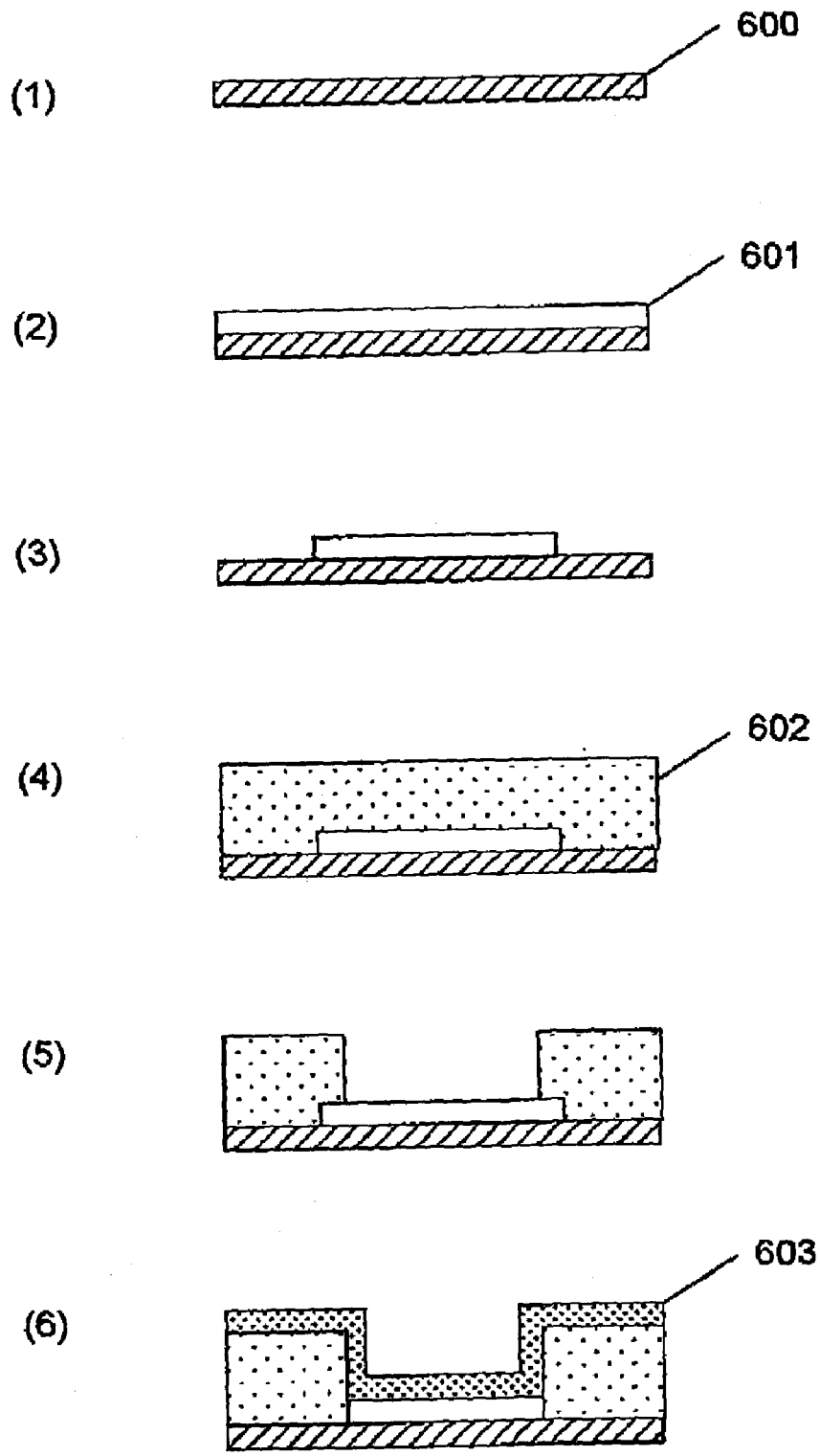
FIGS. 9(a)–9(f) are first explanatory schematics illustrating a process of forming an organic electroluminescence (EL) element according to the first exemplary embodiment.
Figure 11:
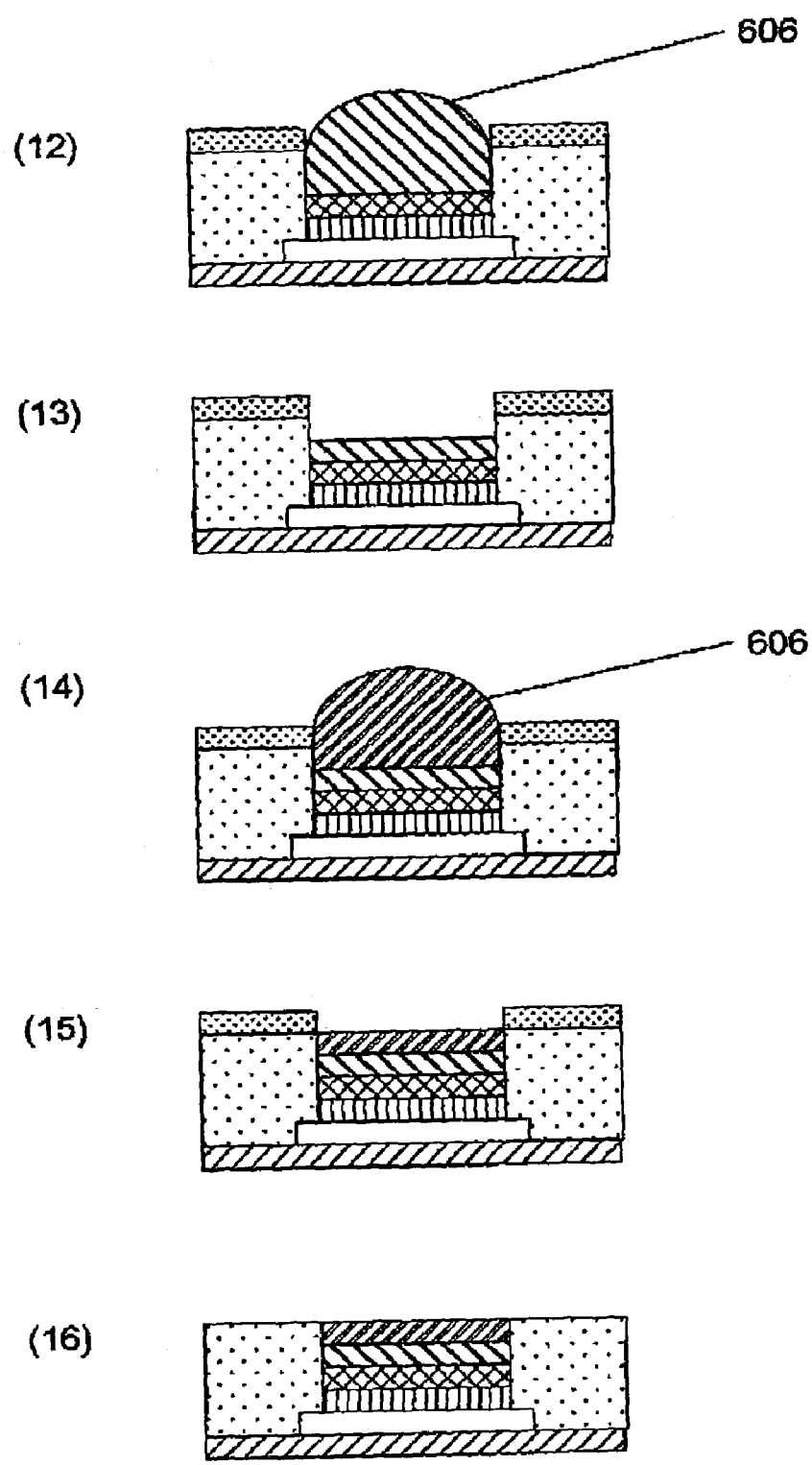
FIGS. 11(a)–11(e) are third explanatory schematics illustrating the process of forming the organic electroluminescence (EL) element according to the first exemplary embodiment.

As the second example, FIGS. 9(*a*)–9(*f*) through FIGS. 11(*a*)–11(*e*) simply illustrate one example of a process of forming a thin film of organic electroluminescence (EL) used as an emissive layer of an emissive element. This process includes forming an electrode 607 located opposite a transparent conductive member 601, formed on a glass substrate 600 and sandwiching an emissive member 605.

First, the transparent conductive member 601 is deposited on the entire surface of the glass substrate 600 and etched to form a desired pattern as shown in FIG. 9(*a*) to FIG. 9(*c*).

Preferably, the glass substrate 600 is cleansed with a wet-type or a dry-type method as explained in the first example.

Moreover, the pattern is formed by etching after the transparent conductive member 601 is formed on the entire surface in this example. On the other hand, it may be also possible to employ a method of implementing the lyophobic surface treatment on the substrate excluding the pattern-formation area and coating only the pattern-formation area with the transparent conductive member 601 in the form of liquid. In that case, the lyophilic surface treatment is preferably implemented on the pattern-formation area.

Next, a light-shielding member 602 is formed over the entire surface of the glass substrate 600, but the light-shielding member remaining in a pixel aperture area is removed in order to form a desired pattern as shown in FIG. 9(*d*) and FIG. 9(*e*).

Subsequently, a fluoroplastic polymerized film 603 is formed over the entire surface of the glass substrate 600 as shown in FIG. 9(*f*). The fluoroplastic polymerized film 603 is formed by the method to form the fluoroplastic polymerized film, shown in the first example.

Figure 10:
FIGS. 10(a)–10(e) are second explanatory schematics illustrating the process of forming the organic electroluminescence (EL) element according to the first exemplary embodiment.
Figure 10:
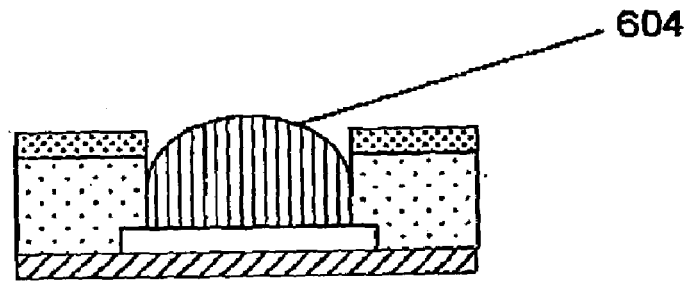
Figure 10:
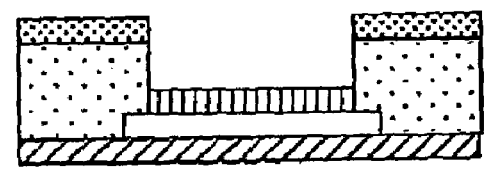
Figure 10:
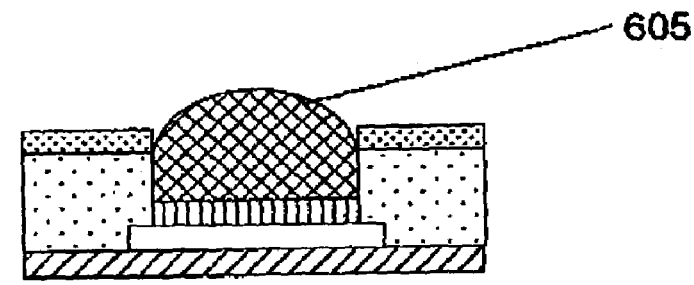
Figure 10:
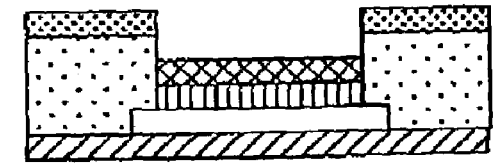

Then, the fluoroplastic polymerized film 603 in the pixel aperture area is removed, thereby forming a desired pattern as shown in FIG. 10(*a*). Here, the mask-material layer on the pattern of the transparent conductive member 601 may be electrolyzed and removed by conducting electric current to the pattern of the transparent conductive member 601, formed on the glass substrate 600, in electrolytic solution. Consequently, it is possible to easily implement the patterning along the conductive material pattern. Therefore, manufacturing cost can be reduced.

In addition, the lyophobic surface treatment of a wet-type method may employ dip treatment using surfactant such as anion, nonion, or cation, treatment using silane, alminate or titanate coupling agent, or SAM film formation. Also, the lyophobic surface treatment of a dry-type method may employ fluoride treatment using plasma, an electron gun, or photoexcitation method, plasma polymerization of fluoroplastic film or silicone film, oxidization treatment using ozone gas generated by plasma, an electron gun or photo-excitation method, or deposition of silane coupling agent.

Moreover, it is possible to enhance mechanical adhesiveness of a lyophobic film by cleansing the surface prior to the lyophobic surface treatment process. When employing a wet-type method, the cleansing can be performed by water-deionizing treatment, oxidization using ozone water, or acid-alkali cleansing (RCA cleansing). When employing a dry-type method, the cleansing can be performed by ultraviolet treatment, oxidization treatment using ozone gas generated by plasma, an electron gun, or photoexcitation method, deposition of silane coupling agent, or plasma polymerization.

Also, it is possible to shorten the time of forming the pattern by heating the glass substrate 600 during the pattern formation as described in the first example.

Furthermore, the glass substrate 600 is heated for 5 minutes in 120° C. after forming the pattern, so as to remove low molecular weight portion in the fluoroplastic polymerized film 603 as described in the first example.

Next, a hole injection member 604 in the form of liquid is applied to the glass substrate 600 and then dried and baked as shown in FIG. 10(b) and FIG. 10(c). The hole injection member 604 is thus formed.

The hole injection member 604 is supplied by a wet-type method, such as an ink-jet method, an LSMCD method, a spin method, spray, dip or direct coating (CAP Coat). How to apply the member is not an essential issue of the present exemplary embodiment.

Next, an emissive member 605 in the form of liquid is applied to the glass substrate 600 and then dried and baked as shown in FIG. 10(d) and FIG. 10(e). The emissive member 605 is thus formed.

Subsequently, an electron transport member 606 in the form of liquid is applied to the glass substrate 600 and then dried and baked as shown in FIG. 11(a) and FIG. 11(b). The emissive member 606 is thus formed.

Then, electrode 607, in the form of liquid, is applied to the glass substrate 600 and then dried and baked as shown in FIG. 11(c) and FIG. 11(d). The electrode 607 is thus formed.

Lastly, mask removal is implemented by irradiating the fluoroplastic polymerized film 603 with ultraviolet rays as shown in FIG. 11(e). Ultraviolet rays cut the bond of the fluoroplastic polymerized film 603 to remove it.

When using a mask material, which can be further decomposed by heat, the patterning time can be shortened by heating as shown in the first example.

The process time can also be shortened by performing heat treatment after the mask material is irradiated with ultraviolet rays. Therefore, the patterning time can be shortened.

Moreover, the polymerized film may be burned and removed away by being exposed to activated ozone gas or oxygen gas. In that case, the fluoroplastic polymerized film 603 is decomposed and removed by carbon dioxide gas and fluorine gas.

Also, it is preferable that only a mask-material layer with a small heat capacity be heated in the above heat treatment from the viewpoint of energy saving.

Mask removal of a wet-type method may employ oxidization treatment using ozone water, organic cleansing using acetone or resist-peeling agent, or supercritical treatment using carbon dioxide. Mask removal of a dry-type method may employ ashing using gas activated by plasma, an electron gun or photoexcitation method instead of the ultraviolet ray irradiation explained in the present example.

Moreover, section molding, which smoothes the surface of the formed pattern, may be implemented, keeping the pattern to a predetermined height before or after the removal of the polymerized film. Precision of pattern process is thereby improved. The molding step can be implemented by etch back or Chemical Mechanical Polishing (CMP). Also, it is preferable to repair the pattern when it is damaged due to molding. The properties of the pattern are thereby improved.

A self-emissive device can be formed in the above manner.

Also, when forming a protective film as a film next to the formed pattern, it is preferable to implement the lyophilic surface treatment for imparting the lyophilic property to the next film, after the removal of the polymerized film. Consequently, it is possible to improve adhesiveness to the next film.

Although the electrode 607 is in the form of liquid material in the present example, it may be formed on the entire surface of the substrate by a dry-type plasma CVD method, plasma polymerization method (MOCVD, atmospheric pressure CVD, P-CVD, optical CVD, thermal CVD), deposition method, or sputtering method. Then, the electrode 607 is etched. The electrode 607 is thus formed.

Moreover, the lyophobic surface treatment is performed once in the present example; however, the treatment can be performed prior to each step of forming a member to which liquid material is applied.

Also, performing cleansing prior to each step improves adhesiveness of a film.

The above described mask removal may follow removal of the remainder of the material for patterning on the surface of the mask. The remainder removal of a wet-type method can be performed by spin etching or by CMP. This can shorten the process time of the mask removing step, and the manufacturing cost can be reduced.

In each of the above steps, the member to be formed may be maintained in an inert gas atmosphere. Also, the member to be processed may be maintained in an inert gas atmosphere when being transported between the respective steps. This prevents oxidization and corrosion of the mask material.

In each of the above steps, the member to be processed may be maintained in an active gas atmosphere. Also, the member to be processed may be maintained in an active gas atmosphere when transported between the above respective steps. This prevents oxidization and reduction of the mask material.

Third Exemplary Embodiment

Next, the third exemplary embodiment is explained. According to a mask forming method of the third exemplary embodiment, gas including fluorine is introduced onto the surface of the member to be processed after patterning mask-material layer of the first exemplary embodiment, while the surface of the member to be processed is irradiated with ultraviolet rays. As a result, the mask forming method of the third exemplary embodiment implements a surface-reforming. The surface-reforming performs the lyophilic surface treatment to render the surface of the member to be processed, in the pattern-formation area, lyophilic to a material for patterning, while simultaneously conducting the lyophobic surface treatment to render the surface of the member to be processed excluding the pattern-formation area lyophobic against the material for patterning. Explanation is omitted as to the same configurations as those in the first or the second exemplary embodiment.

Figure 6:
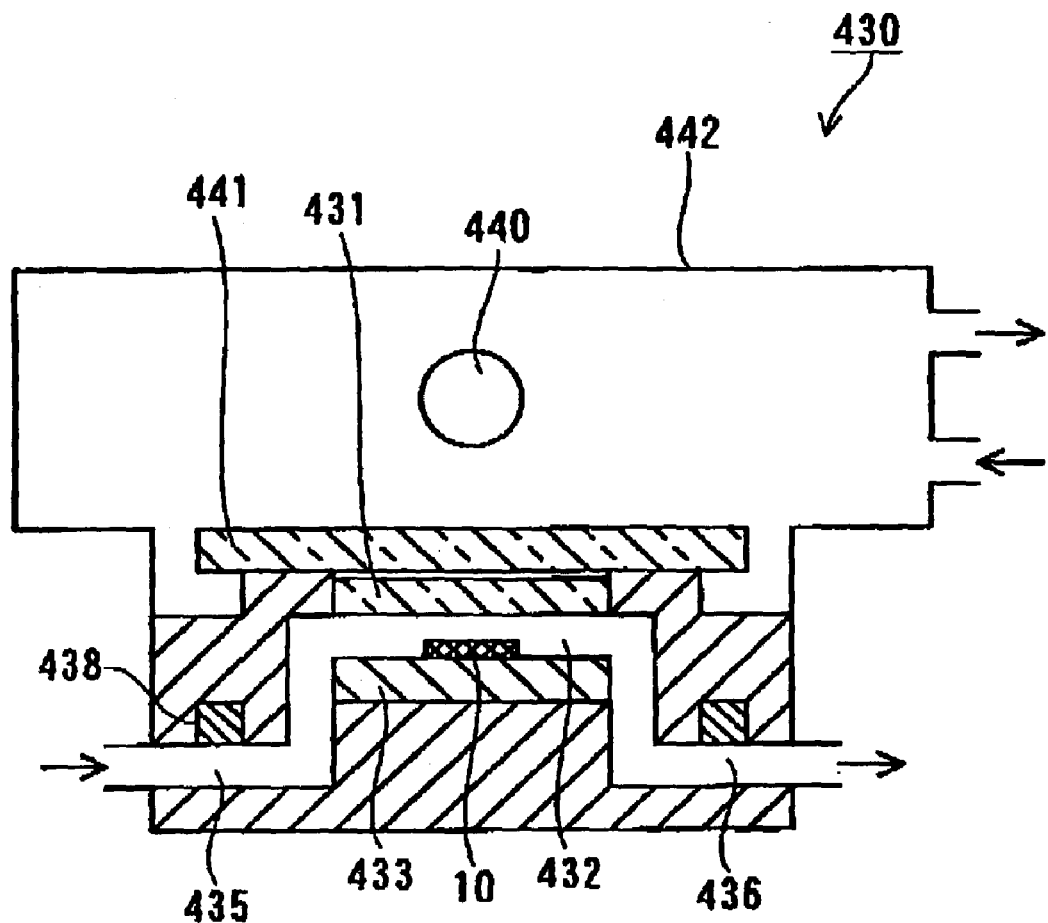
FIG. 6 is an explanatory schematic illustrating a mask-removing device according to the first exemplary embodiment.

The surface-reforming device is the same as that of the explanatory diagram shown in FIG. 6. However, the processed gas supply route 435 and a processed gas exhaust route 436 are formed in front of and/or behind the processing chamber 432. The surface-reforming device is different in that gas, including fluorine activated outside by remote plasma, is supplied to the inside of the processing chamber 432 through the processed gas supply route. Moreover, the processed gas exhaust route 436 is connected to a scrubber, not shown, in the drawing, and excludes exhaust gas.

At the same time, the ultraviolet lamp 440 is placed above the processing chamber 432. The ultraviolet lamp 440 is placed inside the ultraviolet lamp chamber 442, where nitrogen gas is replaceable, because it would be burned when lighted in the atmospheric air. The wall surface of the ultraviolet lamp chamber 442, on the side of the processing chamber 432, is formed of the glass plate 441 that transmits ultraviolet rays, such that the member to be processed 10 can be irradiated with ultraviolet rays. On the other hand, the wall surface of the processing chamber 432 on the side of the ultraviolet lamp chamber 442 is formed of the fluorite 431 that transmits ultraviolet rays. This configuration allows the member to be processed, to be irradiated with ultraviolet rays and also prevents the glass plate 441 from getting eroded by excited active species of fluorine, which is supplied to the processing chamber 432.

Figure 12:
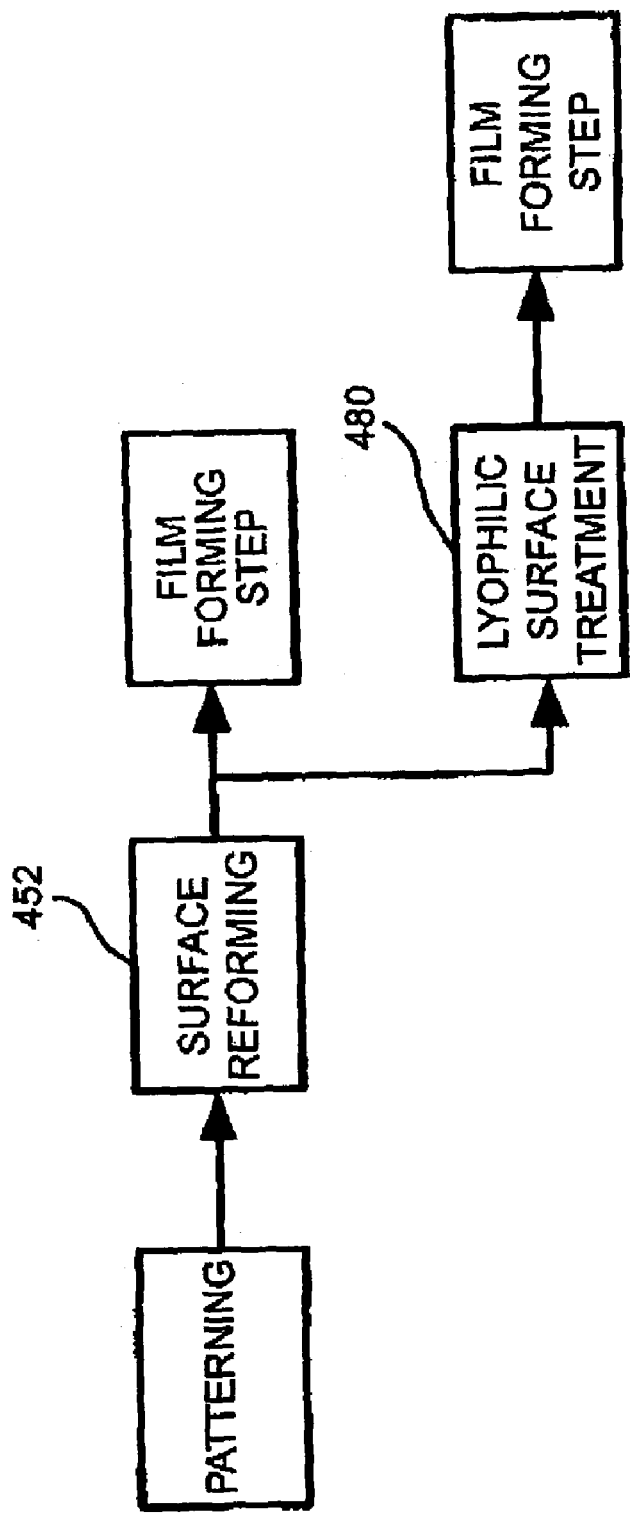
FIG. 12 is a flowchart illustrating a mask forming method and a mask removing method according to a third exemplary embodiment.

Next, steps of the mask forming method and a mask removing method of the third embodiment are explained in detail in the process order. FIG. 12 shows a flowchart illustrating the mask forming method and the mask removing method of the third embodiment.

First of all, the mask forming method is explained. The method is the same as that of the first embodiment up to the patterning step.

Next, the surface of a resist is reformed (S452). More specifically, the surface of the patterned resist is fluoridized. First, the member to be processed 10 is placed inside the processing chamber 432 of the surface-reforming device 430 shown in FIG. 6. Next, gas including fluorine, such as $CF_4$ gas, which is activated in advance by remote plasma, is introduced to the inside of the processing chamber 432 from the processed gas supply route 435. Then, excited active species of fluorine react with an organic matter, such as resist and generate fluorine compound lyophobic against the surface of the organic matter. Remote plasma can activate gas including fluorine not only by the method of applying high-frequency voltage but also by the method of irradiating electron rays or ultraviolet rays. At the same time, the pattern-formation area does not take on lyophobic properties despite being exposed to gas, including activated fluorine, because a silicon oxide film is exposed on the pattern-formation area.

Simultaneously, the surface of the member to be processed 10 is irradiated with ultraviolet rays. Then, this facilitates reaction between excited active species of fluorine and the resist film, thereby giving a strong lyophobic property to the surface of the resist film. The fluorine compound is removed from the surface of the silicon oxide film on the pattern-formation area, and the silicon oxide film actively maintains its inherent lyophilic property.

The lyophilic surface treatment by irradiating ultraviolet rays may be added in order to further apply the lyophilic property to the pattern-formation area (S480). This improves adhesiveness between the member to be processed and the material for patterning.

Also, it is preferable to reform the surface of the above-mentioned resist before heating the resist. This is because it is possible to implement the fluoride treatment easily by having fluorine to react with the resist at any time before the resist ends its reaction due to heating process.

The mask for the material for patterning can be formed in the above described manner.

According to the mask forming method of the third exemplary embodiment, gas including fluorine is introduced onto the surface of the member to be processed while the member to be processed is irradiated with ultraviolet rays. Consequently, the mask forming method performs the lyophilic surface treatment to render the surface of the member to be processed, in the pattern-formation area, lyophilic to the material for patterning, while performing a step of the lyophobic surface treatment to render the surface of the member to be processed, excluding the pattern-formation area, lyophobic against the material for patterning. Accordingly, the number of steps is decreased, and the manufacturing cost can be reduced.

The method of selectively reforming the surface is explained above, taking the member to be processed including the resist and the silicon oxide on the surface thereof as an example. However, the present exemplary embodiment is not limited to the above and is widely applicable to a member to be processed including an organic matter other than a resist and an oxide other than a silicon oxide on the surface thereof.

Forth Exemplary Embodiment

The following explains the fourth exemplary embodiment. A mask forming method of the fourth exemplary embodiment introduces source gas of the mask material onto the surface of the member to be processed and irradiates ultraviolet rays to the surface of the member to be processed in the pattern-formation area. Hence, the method prevents formation of the mask-material layer in the pattern-formation area and directly draws the mask-material layer on the surface of the member to be processed, excluding the pattern-formation area. Explanation of the same configuration as those in the first through third exemplary embodiments is omitted.

Figure 13:
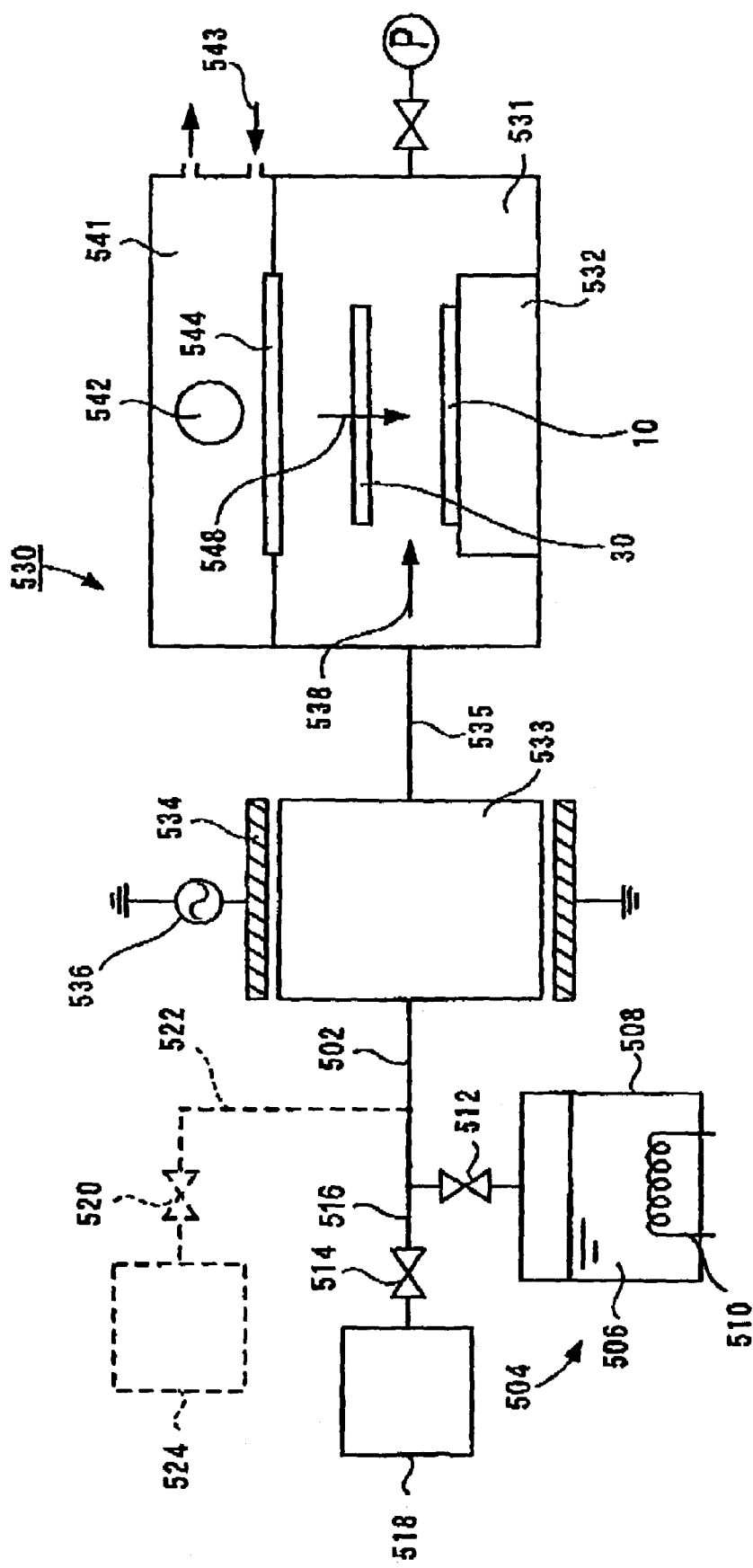
FIG. 13 is an explanatory schematic illustrating a direct imager.

The above-mentioned formation of the fluoroplastic polymerized film and irradiation of ultraviolet rays are performed using such a lyophobic surface treatment device as below. FIG. 13 shows a schematic diagram of a direct imager. A lyophobic surface treatment device 530 includes a processing chamber 531, and a stage 532 capable of mounting the member to be processed 10, is formed inside the processing chamber 531. Also, a mask 30 can be placed above the stage. Moreover, an ultraviolet lamp 542 is arranged above the chamber 531. The ultraviolet lamp 542 is placed inside an ultraviolet lamp chamber 541, where nitrogen gas 543 is replaceable, because it would be burned when lighted in the atmospheric air. The boundary between the ultraviolet lamp chamber 541 and the processing chamber 531 is formed of a fluorite 544 that transmits ultraviolet rays, such that the member to be processed can be irradiated with ultraviolet rays. Also, the member to be processed is prevented from getting eroded by excited active species of fluorine, which is supplied to the processing chamber 531.

A plasma chamber 533 is connected to the processing chamber 531 through a supplying pipe 535. The plasma chamber is formed between counter electrodes 534, and a high-frequency power source 536 is connected to the counter electrodes 534. A processed gas supply unit 504 is connected to the plasma chamber 533 through a supplying pipe 502 provided with a flow volume control valve 512. The processed gas supply unit 504 includes a container 508 that stores liquid organic matter 506 including straight-chain PFC such as fluorinert. The container 508 is provided with a heating medium 510 which serves as a heating head, such that the liquid organic matter 506 is heated and vaporized. A carrier gas supply unit 518 is connected to the plasma chamber 533 through a carrier pipe 516 provided with a flow volume control valve 514 on the lower course side of the flow volume control valve 512 of the supplying pipe 502. Inert gas, such as nitrogen or argon, is used as carrier gas. Moreover, as indicated by the dotted lines of FIG. 13, a second processed gas supply unit 524 is connected to the supplying pipe 502 through a pipe 522 provided with a flow volume control valve 520. Then, $CF_4$ is supplied and added from the second processed gas supply unit 524 to vapor of the liquid organic matter 506 as the second processed gas.

Figure 14:
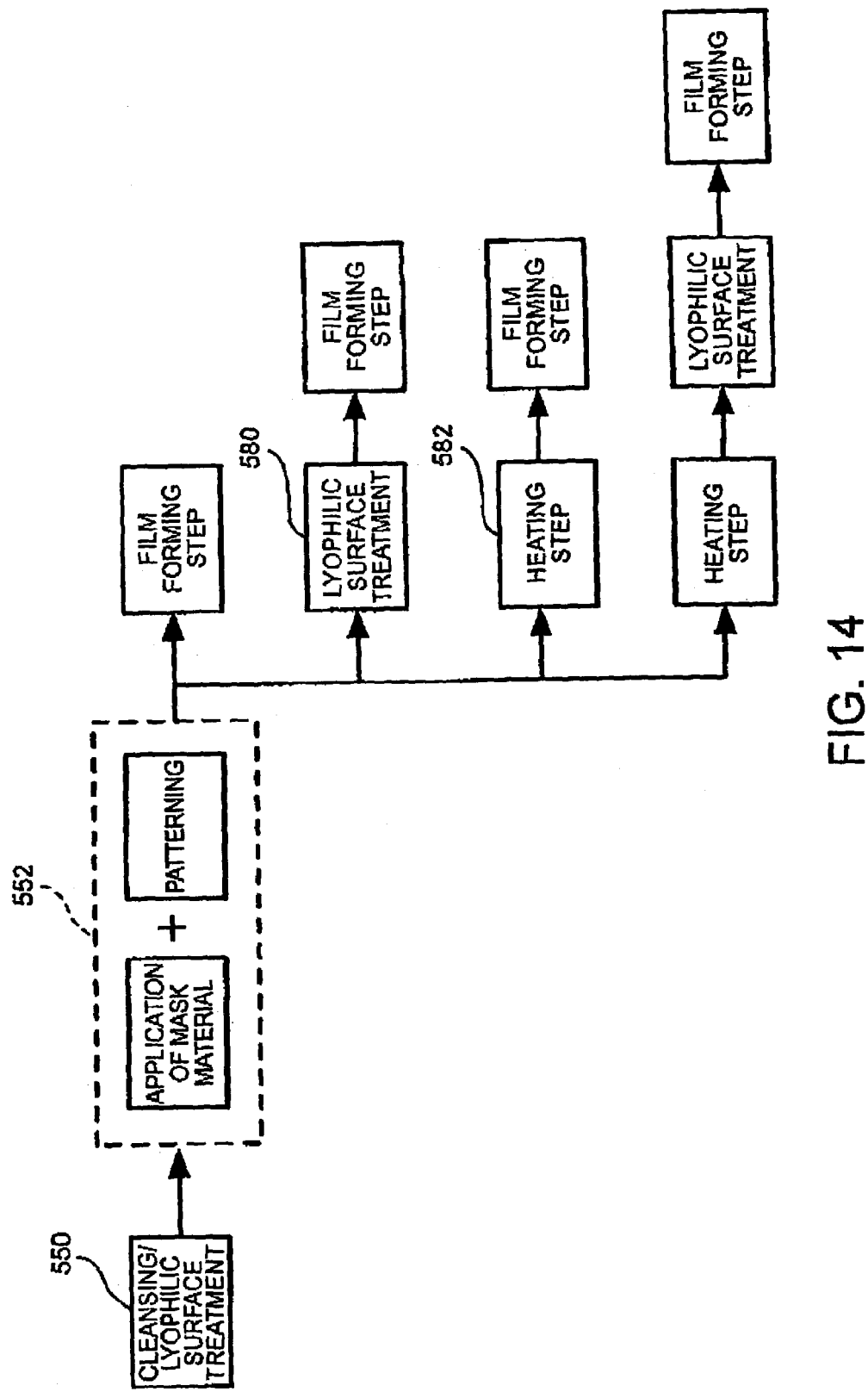
FIG. 14 is a flowchart of a mask forming method according to a fourth exemplary embodiment.
Figure 15:
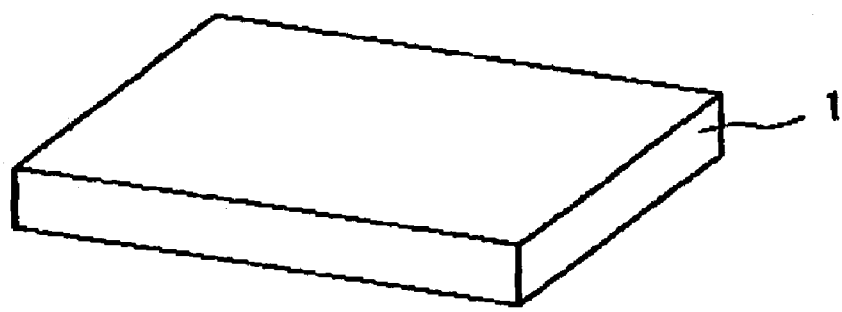
FIG. 15 is a schematic of a first step of a related art patterning.
Figure 15:
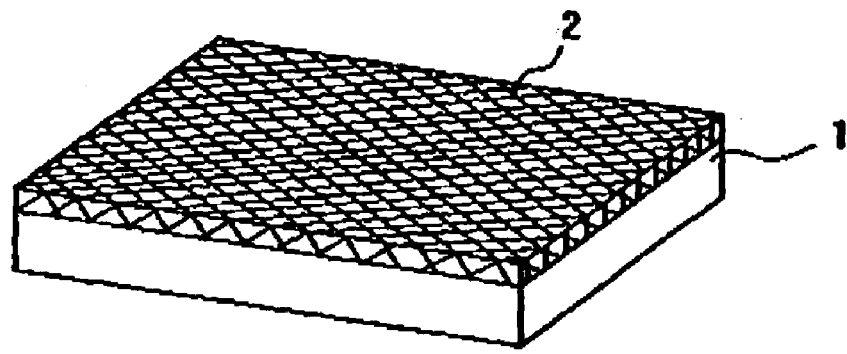
Figure 15:
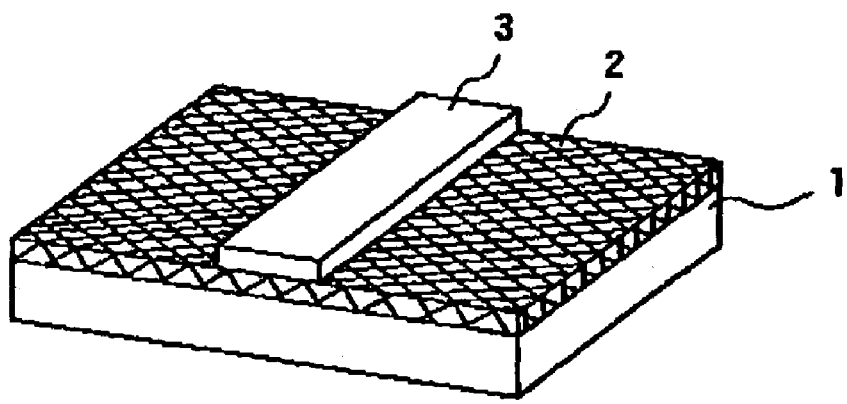
Figure 16:
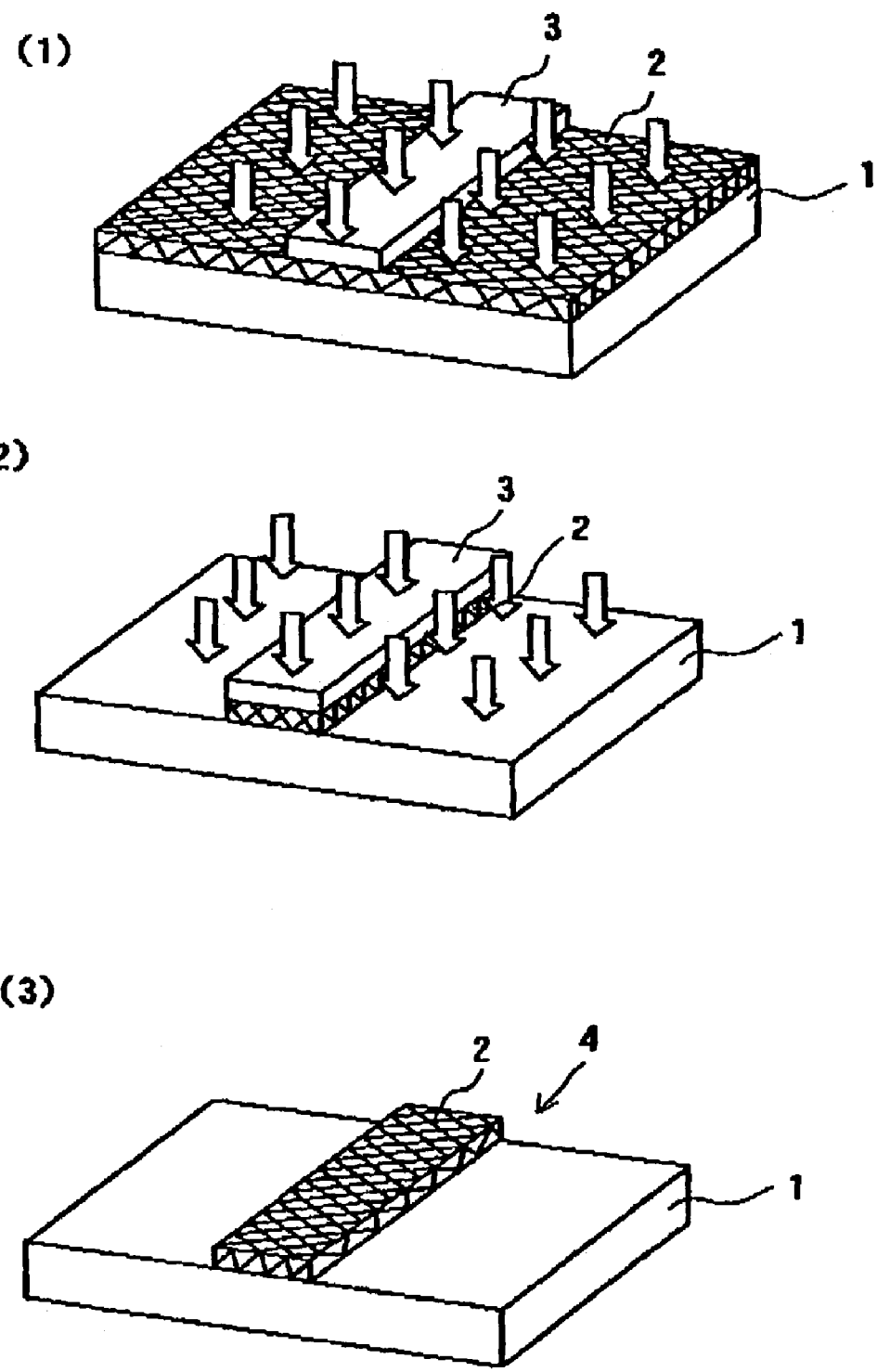
FIG. 16 is a schematic of a second step of the related art patterning.

Next, the mask forming method and the mask removing method of the fourth exemplary embodiment are explained in detail in process order. FIG. 14 shows a flowchart of the mask forming method of the fourth exemplary embodiment.

The mask forming method is first explained. First, the member to be processed is cleansed, and the surface thereof is treated to have the lyophilic property (S550).

Subsequently, the polymerized film is formed and pattered simultaneously (S552). Specifically, the member to be processed 10 is set on the stage 532 of the lyophobic surface treatment device 530 as shown in FIG. 13, and the mask 30 is placed above the stage 532. Next, the ultraviolet lamp 542 is lit on so as to irradiate the member to be processed 10 with ultraviolet rays 548. As described above, since the mask 30 is light-transmissive only in the portion thereof corresponding to the pattern-formation area of the member to be processed 10, only the pattern-formation area is irradiated with ultraviolet rays 548 through the mask 30.

At the same time, activated source gas 538 is supplied to the inside of the chamber so as to form the fluoroplastic polymerized film over the surface of the member to be processed 10. More specifically, the liquid organic matter 506 including straight-chain PFC is heated and vaporized so as to be introduced into the plasma chamber 533 together with carrier gas. Also, low molecular weight PFC gas such as $CF_4$ may be added as required. When high-frequency voltage is applied to vapor of straight-chain PFC within the plasma chamber 533, bond of straight-chain PFC is partially cut to be active. The activated straight-chain PFC is supplied to the processing chamber 531. Straight-chain PFC can be activated by irradiation of electron rays or ultraviolet rays instead of the application of high-frequency voltage.

In the above manner, active straight-chain PFC polymerizes over the surface of the member to be processed 10, excluding the pattern-formation area, by reaching there so as to form the fluoroplastic polymerized film. The thickness of the polymerized film is set to 100 angstrom or less. On the other hand, polymerization is prevented with ultraviolet rays in the pattern-formation area, and/or bond of the formed polymerized film is cut with ultraviolet rays, thereby preventing formation of the fluoroplastic polymerized film. In addition, organic matters attached to the pattern-formation area such as resist are removed, thereby applying the lyophilic property to the area.

Moreover, the lyophilic surface treatment using irradiation of ultraviolet rays may be added in order to further apply the lyophilic property to the pattern-formation area (S580). This improves adhesiveness of the member to be processed and the material for patterning.

Also, the fluoroplastic polymerized film may be heated (S582). This allows a low molecular weight organic matter contained in the polymerized film to be vaporized and removed, such that the low molecular weight organic matter is prevented from getting mixed in the material for patterning in the later film forming step. The heating treatment may be performed simultaneously with formation of the polymerized film.

The mask for the material for patterning is formed in the above described manner.

According to the mask forming method of the above fourth exemplary embodiment, source gas of the mask material is introduced onto the surface of the member to be processed, while ultraviolet rays are irradiated onto the surface of the member to be processed in the pattern-formation area. Consequently, the mask forming method implements a step of direct draw, preventing formation of the mask-material layer in the pattern-formation area. Hence, the number of steps can be decreased, and the manufacturing cost can be reduced.

The above explains the method of performing direct draw by irradiating light simultaneously with the formation of the polymerized film. A hard mask may be mounted on the surface of the member to be processed, including an opening portion except in the pattern-formation area, and the polymerized film is formed in the opening portion, such that direct draw is performed.

The mask material may be irradiated with light simultaneously while being directly drawn so as to be hardened. Light may be simultaneously irradiated while the mask material is supplied, such that the mask material irradiated with light is hardened while being directly drawn. In that case, the member to be processed may also be heated.

A structure, in which a functional thin film is formed on a substrate by the pattern forming method of the present invention, may be applied to semiconductor devices, electric circuits, display modules and emissive devices. The thickness of the functional thin film may arbitrarily be set depending on how the fine structure is used; however, the thickness is preferably 0.02 to 4 µm.

Applying the pattern forming method of the present invention to those mentioned above yields high quality, and the outcome is superior to that of the related art also in light of simplified manufacturing process and manufacturing cost.

The invention claimed is:

1. A mask forming method, comprising:
   forming a lyophobic mask-material layer over an entire surface of a member to be processed so as to form a desired pattern using liquid material for patterning;
   patterning the mask-material layer in a pattern-formation area by partially removing the mask-material layer, the pattern-formation area being partially located on a surface of the member to be processed;
   forming the desired pattern by coating the liquid material for patterning over the pattern-formation area;
   drying the liquid material for patterning the pattern-formation area; and
   removing a mask, which includes a remainder of the mask-material layer, by conducting an electric current through an electrolytic solution to a conductive material pattern disposed on the surface of the member to be processed.

2. The mask forming method according to claim 1, the mask-material layer forming and the patterning including exposing the member to be processed to gas including fluorine, and irradiating the member to be processed with electromagnetic waves so as to implement a lyophilic surface treatment such that the surface of the member to be processed in the pattern-formation area is rendered lyophilic to the liquid material for patterning, while simultaneously implementing a lyophobic surface treatment such that the surface of the member to be processed, excluding the pattern-formation area, is rendered lyophobic against the liquid material for patterning.

3. The mask forming method according to claim 1, further comprising:

cleansing the surface of the member to be processed prior to forming the mask-material layer.

4. The mask forming method according to claim 1, further comprising:
implementing the lyophilic surface treatment prior to forming the mask-material layer so as to render the entire surface of the member to be processed lyophilic to the mask-material layer.

5. The mask forming method according to claim 1, further comprising:
implementing the lyophobic surface treatment prior to forming the mask-material layer so as to render the entire surface of the member to be processed lyophobic against the mask material-layer.

6. The mask forming method according to claim 1, further comprising:
implementing the lyophilic surface treatment prior to forming the mask-material layer so as to render the surface of the member to be processed in the pattern-formation area lyophilic to the mask-material layer; and
implementing the lyophobic surface treatment so as to render the surface of the member to be processed excluding the pattern-formation area lyophobic against the mask-material layer.

7. The mask forming method according to claim 1, further comprising:
implementing the lyophilic surface treatment prior to patterning so as to render a surface of the mask-material layer in the pattern-formation area lyophilic to a mask removing material.

8. The mask forming method according to claim 1, further comprising:
implementing the lyophobic surface treatment prior to patterning so as to render a surface of the mask-material layer excluding the pattern-formation area lyophobic against a mask removing material.

9. The mask forming method according to claim 1, further comprising:
implementing the lyophilic surface treatment prior to patterning so as to render a surface of the mask-material layer in the pattern-formation area lyophilic to a mask removing material; and
implementing the lyophobic surface treatment so as to render the surface of the mask-material layer, excluding the pattern-formation area, lyophobic against the mask removing material.

10. The mask forming method according to claim 1, further comprising:
implementing the lyophobic surface treatment prior to patterning so as to render an entire surface of the mask-material layer lyophobic against the material for patterning.

11. The mask forming method according to claim 1, further comprising:
implementing heat treatment before or after patterning.

12. The mask forming method according to claim 1, the mask forming method further comprising:
removing the liquid material for patterning on the surface of the mask prior to the removing of the mask.

13. The mask forming method according to claim 1, the mask forming method further comprising:
molding a surface of the pattern prior to the removing the mask.

14. The mask forming method according to claim 1, the mask forming method further comprising:
cleansing the member to be processed prior to the removing the mask.

15. The mask forming method according to claim 1, the mask forming method further comprising:
implementing the lyophilic surface treatment so as to impart a property lyophilic to a mask removing material prior to the removing the mask.

16. The mask forming method according to claim 1, the mask forming method further comprising:
implementing preliminary heating on the mask prior to the removing the mask.

17. The mask forming method according to claim 1, the mask forming method further comprising:
molding a surface of the pattern after the removing the mask.

18. The mask forming method according to claim 1, the mask forming method further comprising:
repairing damage on the pattern after the removing the mask.

19. The mask forming method according to claim 1, the mask forming method further comprising:
implementing the lyophilic surface treatment so as to impart a property lyophilic to a material of a film to be formed next to the pattern after the removing the mask.

20. The mask forming method according to claim 1, the member to be processed being maintained in an inert gas atmosphere when implementing the removing the mask using the electrolytic solution.

21. The mask forming method according to claim 1, the member to be processed being maintained in inert gas atmosphere when transported between patterning the mask-material layer, forming the desired pattern, drying the liquid material for patterning, and removing the mask.

22. The mask forming method according to claim 1, the member to be processed being maintained in active gas atmosphere when implementing the method.

23. The mask forming method according to claim 1, the member to be processed being maintained in active gas atmosphere when transported between patterning the mask-material layer, forming the desired pattern, drying the liquid material for patterning, and removing the mask.

* * * * *